US012660077B2

(12) United States Patent
Lim et al.

(10) Patent No.: US 12,660,077 B2
(45) Date of Patent: Jun. 16, 2026

(54) PACKAGE BOTTOM SIDE THERMAL SOLUTION WITH DISCRETE HAT-SHAPED COPPER SPREADER COMPONENT

(71) Applicant: Intel Corporation, Santa Clara, CA (US)

(72) Inventors: Min Suet Lim, Gelugor (MY); Tin Poay Chuah, Bayan Baru (MY); Yew San Lim, Gelugor (MY); Jeff Ku, Taipei City (TW); Twan Sing Loo, Butterworth (MY); Poh Boon Khoo, Perai (MY); Jiun Hann Sir, Gelugor (MY)

(73) Assignee: Intel Corporation, Santa Clara, CA (US)

( * ) Notice: Subject to any disclaimer, the term of this patent is extended or adjusted under 35 U.S.C. 154(b) by 30 days.

(21) Appl. No.: 17/834,641

(22) Filed: Jun. 7, 2022

(65) Prior Publication Data

US 2023/0397323 A1     Dec. 7, 2023

(51) Int. Cl.
| | |
|---|---|
| *H05K 1/02* | (2006.01) |
| *H05K 1/181* | (2026.01) |
| *H05K 3/22* | (2006.01) |
| *H10W 40/22* | (2026.01) |
| *H10W 40/70* | (2026.01) |

(Continued)

(52) U.S. Cl.
CPC ............. *H05K 1/0204* (2013.01); *H05K 3/22* (2013.01); *H10W 40/22* (2026.01); *H10W 40/70* (2026.01); *H10W 90/00* (2026.01); *H05K 1/181* (2013.01); *H05K 2201/066*

(2013.01); *H05K 2201/1003* (2013.01); *H05K 2201/10166* (2013.01); *H05K 2201/10378* (2013.01); *H05K 2201/10409* (2013.01); *H05K 2201/10515* (2013.01); *H05K 2201/1053* (2013.01); *H05K 2201/1056* (2013.01); *H05K 2203/0195* (2013.01); *H10W 72/073* (2026.01); *H10W 72/877* (2026.01); *H10W 74/15* (2026.01); *H10W 90/724* (2026.01); *H10W 90/734* (2026.01)

(58) Field of Classification Search
CPC ............................ H01L 23/367; H05K 1/0204
See application file for complete search history.

(56) References Cited

U.S. PATENT DOCUMENTS

| | | | | |
|---|---|---|---|---|
| 5,045,914 A | * | 9/1991 | Casto ................... | H05K 3/3436 257/E23.032 |
| 6,208,517 B1 | * | 3/2001 | Prince ................. | H01L 23/4093 257/713 |

(Continued)

*Primary Examiner* — Erik Kielin
(74) *Attorney, Agent, or Firm* — Schwabe, Williamson & Wyatt P.C.

(57) ABSTRACT

Embodiments disclosed herein include a printed circuit board (PCB). In an embodiment, the PCB comprises a substrate with a first surface and a second surface opposite from the first surface. In an embodiment, a first slot is through a thickness of the substrate, and a second slot is through the thickness of the substrate, where the first slot is parallel to the second slot. In an embodiment, a metal plate is provided on the PCB. In an embodiment the metal plate comprises a first portion over the first surface of the substrate between the first slot and the second slot, a second portion connected to the first portion, wherein the second portion is in the first slot, and a third portion connected to the first portion, wherein the third portion is in the second slot.

16 Claims, 20 Drawing Sheets

(51) Int. Cl.
  *H10W 72/00*   (2026.01)
  *H10W 74/15*   (2026.01)
  *H10W 90/00*   (2026.01)

(56)      References Cited

U.S. PATENT DOCUMENTS

| | | | |
|---|---|---|---|
| 2008/0150125 A1* | 6/2008 | Braunisch | H01L 25/0657 |
| | | | 257/E23.101 |
| 2009/0289352 A1* | 11/2009 | Horie | H01L 23/4093 |
| | | | 438/122 |
| 2019/0090343 A1* | 3/2019 | Mische | H05K 1/181 |
| 2019/0252756 A1* | 8/2019 | Lee | H01L 23/10 |
| 2022/0386448 A1* | 12/2022 | Milyavsky | H01L 23/4093 |
| 2023/0054252 A1* | 2/2023 | Hiraoka | H05K 9/0039 |

* cited by examiner

PACKAGE BOTTOM SIDE THERMAL SOLUTION WITH DISCRETE HAT-SHAPED COPPER SPREADER COMPONENT

TECHNICAL FIELD

Embodiments of the present disclosure relate to electronic packages, and more particularly to packaging architectures that includes a bottom side thermal solution with a discrete hat-shaped copper heat spreader component.

BACKGROUND

Power and thermal performance have been an increasingly challenging concern in the semiconductor packaging industry. Power delivery performance has been improved through the use of discrete voltage regulator (VR) dies. The VR dies may be placed below the package substrate. However, the VR dies generate a lot of heat. Current solutions only provide thermal control from the front side of the package substrate. This does not adequately cool the hot VR dies that are buried in the package substrate.

Another option is to move the VR dies to the backside of the electronic package so they are more accessible to thermal solutions. However, moving the VR dies to the backside of the electronic package (e.g., to the backside of the printed circuit board (PCB)), increases the Z-height of the electronic package, and may not be suitable for all architectures.

In yet another proposed solution, bottom side heat dissipation may include an increase in the number of package BGAs to create more vertical thermal paths, or even using embedded copper plugs in the PCB to draw heat to the PCB bottom. However, embedding copper blocks/slugs limits the routing channel width across the board. This is especially critical for narrow boards designed in a fanless system. Thermal vias filled with copper and mixed plated through hole (PTH) sizes incurs additional cost and complexity in designs. Additionally, such solutions allows heat to be drawn through the PMIC die surface. This, however, has lower effectiveness without also drawing heat from the entirety of the package bottom region.

EMBODIMENTS OF THE PRESENT DISCLOSURE

Described herein are packaging architectures that includes a bottom side thermal solution with a discrete hat-shaped copper heat spreader component, in accordance with various embodiments. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

Figure 1:
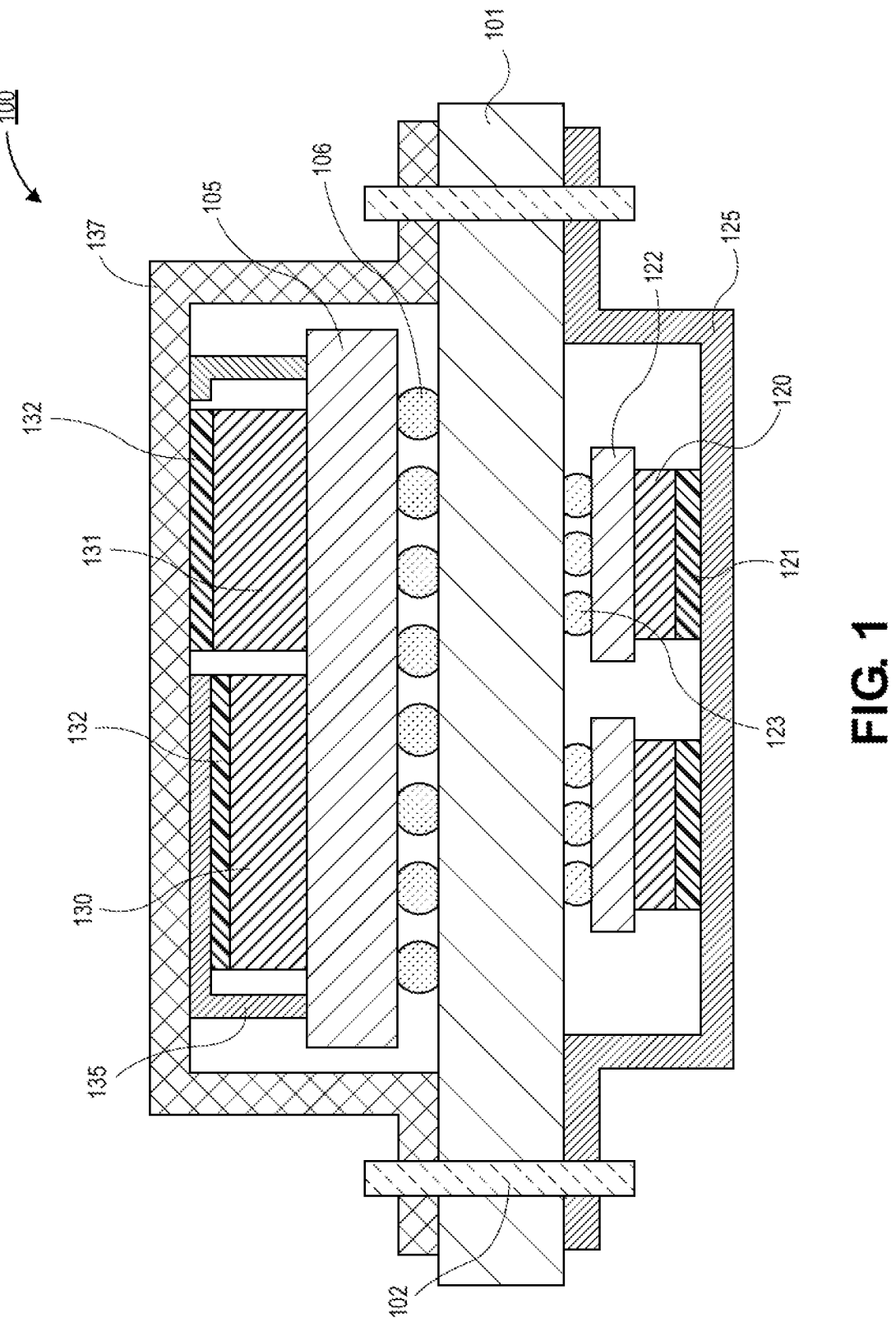
FIG. 1 is a cross-sectional illustration of an electronic system with voltage regulator (VR) dies on a backside of a board.

Referring now to FIG. 1, a cross-sectional illustration of an electronic system 100 is shown. The electronic system 100 includes a board 101, such as a printed circuit board (PCB). A package substrate 105 is coupled to the board 101 by interconnects 106. A first die 130 and a second die 131 are on the package substrate 105. Thermal interface material (TIM) 132 is over the dies 130 and 131 in order to couple the dies to a heat spreader 135 and a thermal solution 137.

In order to provide power regulation, a pair of voltage regulator (VR) dies 120 are provided on the backside of the board 101. The VR dies 120 may be on a package substrate 122 that is coupled to the board 101 by interconnects 123. TIM 121 may thermally couple the VR dies 120 to a heat spreader 125. The heat spreader 125 and the thermal solution 137 may be coupled to the board 101 by pins 102 (e.g., screws or other fasteners) that pass through the board 101. In such an architecture, the VR dies 120 are easily accessible for thermal control. However, such an architecture increases the Z-height of the electronic system 100 and is not desirable.

Figure 2:
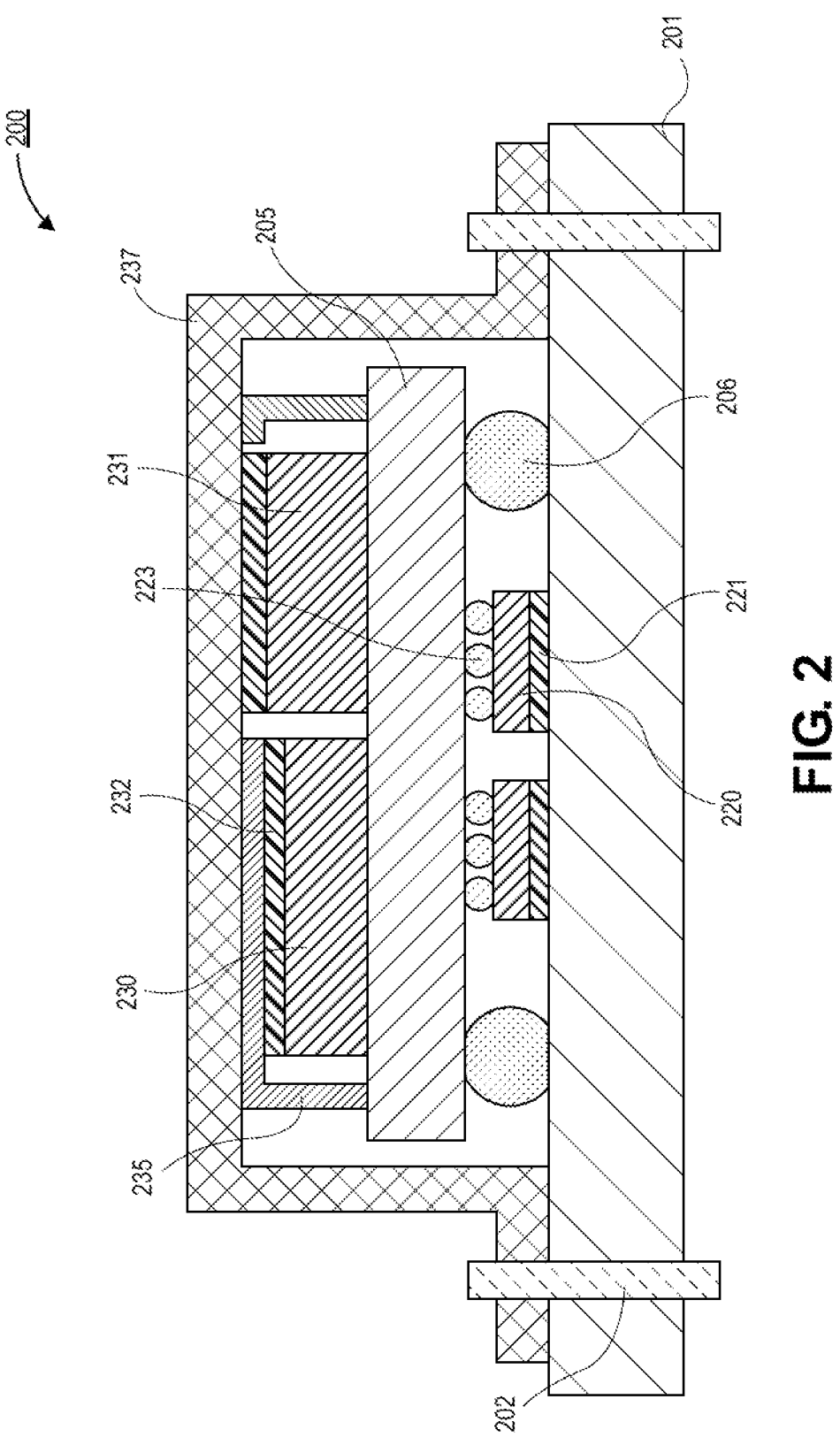
FIG. 2 is a cross-sectional illustration of an electronic system with VR dies between the package substrate and the board.

Another architecture is shown in FIG. 2. As shown, the board 201 only has components on a front side surface. A package substrate 205 may be coupled to the board 201 by interconnects 206. Dies 230 and 231 may be over the package substrate 205 and thermally coupled to a heat spreader 235 and a thermal solution 237 by TIM 232. The thermal solution 237 may be coupled to the board 201 by pins 202.

Additionally, VR dies 220 are provided between the package substrate 205 and the board 201. The bottom side of the VR dies 220 may be thermally coupled to the board 201 by TIM 221. Moving the VR dies 220 between the package substrate 205 and the board 201 decreases the Z-height of the electronic system 200. However, such an architecture makes it more difficult to cool the VR dies 220 since a heat spreader cannot get access to the VR dies 220. Instead, solutions such as copper slugs through the board 201, and the like may be used. Unfortunately, the inclusion copper slugs and other similar architectures increases the complexity of the board 201 fabrication and negatively impacts on board 201 routing.

Accordingly, embodiments disclosed herein include electronic systems with improved backside thermal control. In embodiments disclosed herein, the VR dies are sandwiched between the package substrate and the PCB, similar to the architecture shown in FIG. 2. This reduces the Z-height of the electronic package. However, in contrast to FIG. 2, the thermal energy from the VR dies is removed through the use of a discrete heat spreader component that is inserted through slots in the PCB. In some embodiments, a standard TIM is used between the heat spreader and the VR dies. In other embodiments, the architecture may be modified in order to use a liquid TIM to further improve heat extraction.

Figure 3A:
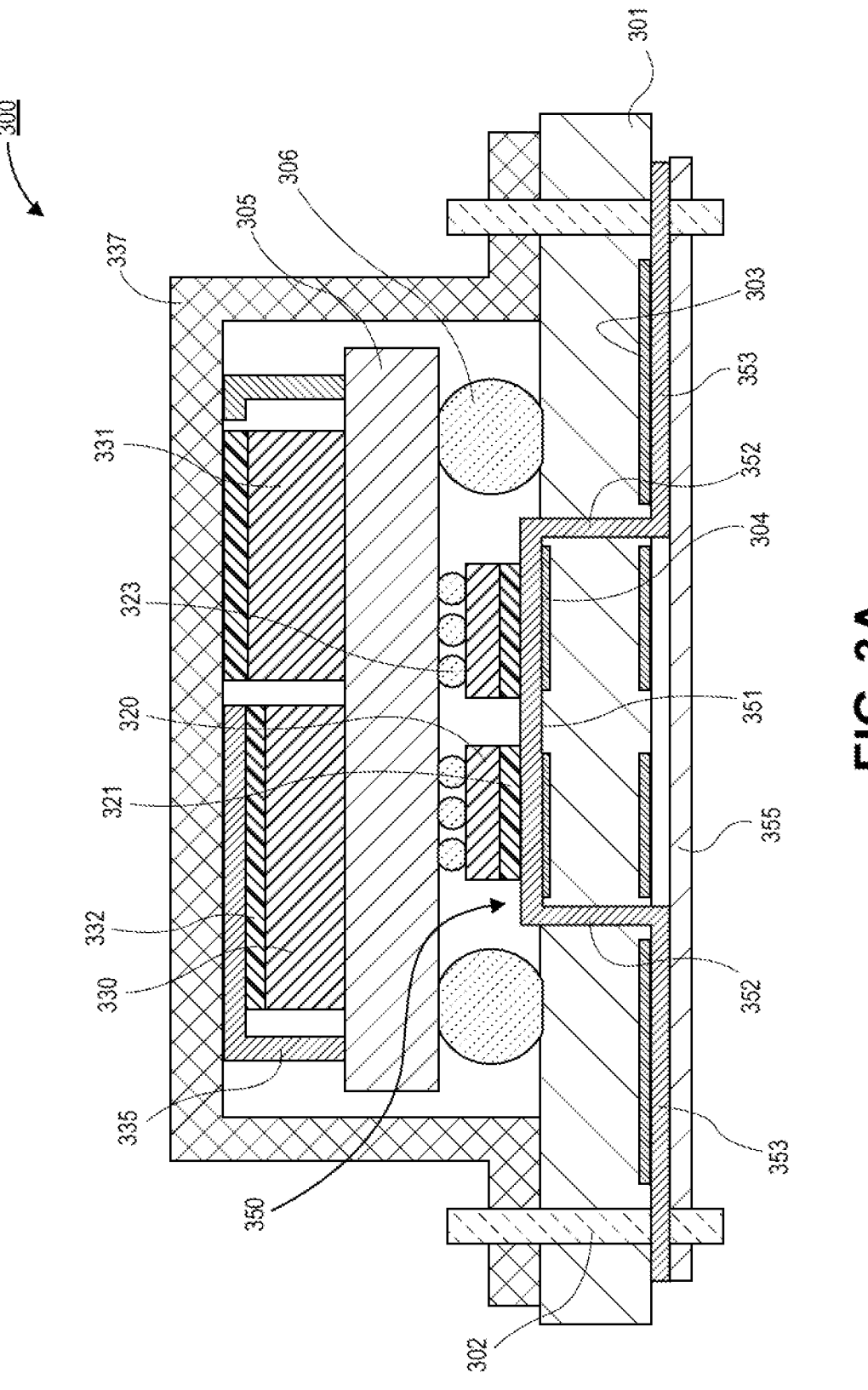
FIG. 3A is a cross-sectional illustration of an electronic system with VR dies between the package substrate and the board that includes a discrete heat spreader integrated with the board, in accordance with an embodiment.

Referring now to FIG. 3A, a cross-sectional illustration of an electronic system 300 is shown, in accordance with an embodiment. In an embodiment, the electronic system 300 may include a board 301, such as a PCB. A package substrate 305 may be coupled to the board 301 by interconnects 306. The interconnects 306 may be solder balls or the like. In an embodiment, the package substrate 305 may be a cored or coreless package substrate. Conductive routing (not shown) may be provided in the package substrate 305. In an embodiment, a first die 330 and a second die 331 may be coupled to the package substrate (e.g., by first level interconnects (FLIs) which are not shown for simplicity). In one embodiment, the first die 330 may be a compute die and the second die 331 may be a memory die or dies. Though it is to be appreciated that the first die 330 and the second die 331 may be any type of die. In an embodiment, a TIM 332 may be provided over the dies 330 and 331. The TIM 332 may thermally couple the dies 330 and 331 to a top heat spreader 335 and a thermal solution 337.

In an embodiment, one or more VR dies 320 are provided between the package substrate 305 and the board 301. The VR dies 320 may be electrically coupled to the package substrate 305 by interconnects 323, such as solder balls or the like. A backside of the VR dies 320 may be covered with a TIM 321.

In order to provide thermal control of the VR dies 320, a backside heat spreader 350 is provided. The heat spreader 350 may be a thermally conductive plate such as a copper plate or any other type of metal. Particularly, it is to be appreciated that the heat spreader 350 is a discrete component from the board 301. That is, the heat spreader 350 is attached to the board 301, and is not fabricated as part of the board (like embedded copper slugs, or the like). As will be described in greater detail below, the heat spreader 350 is inserted through slots in the board 301. The heat spreader 350 is then folded in order to bring the heat spreader 350 into contact with metal (e.g., ground metal) on the surfaces of the board 301.

For example, the heat spreader 350 may include a first portion 351 that is over the top surface of the board 301 and thermally coupled to metal 304. The second portions 352 of the heat spreader 350 pass through a thickness of the board 301, and third portions 353 of the heat spreader 350 may be folded over to be thermally coupled to metal 303 on a backside of the board 301. The metal 304 and 303 may be configured to be grounded. As such, the heat spreader 350 may also be grounded. In a particular embodiment, the cross-section of the heat spreader 350 may have a top hat shape. That is, the heat spreader includes a first horizontal portion (i.e., first portion 351), a pair of vertical portions on each end of the first horizontal portion (i.e., second portions 352), and a pair of horizontal portions at a bottom of the vertical portions (i.e., third portions 353). In an embodiment, the second portions 352 may be referred to as legs, and the third portions 353 may be referred to as feet. That is, a leg and a foot may be provided on each side of the first portion 351.

In an embodiment, a back plate 355 may be provided over the back surface of the board 301 and the heat spreader 350. The back plate 355 may be a material that further improves the heat spreading. For example, the back plate 355 may be a graphite layer. The heat spreader 350, the back plate 355, and the top side thermal solution 337 may all be coupled to the board 301 through pins 302, such as screws, bolts, or any other fastening mechanism.

Figure 3B:
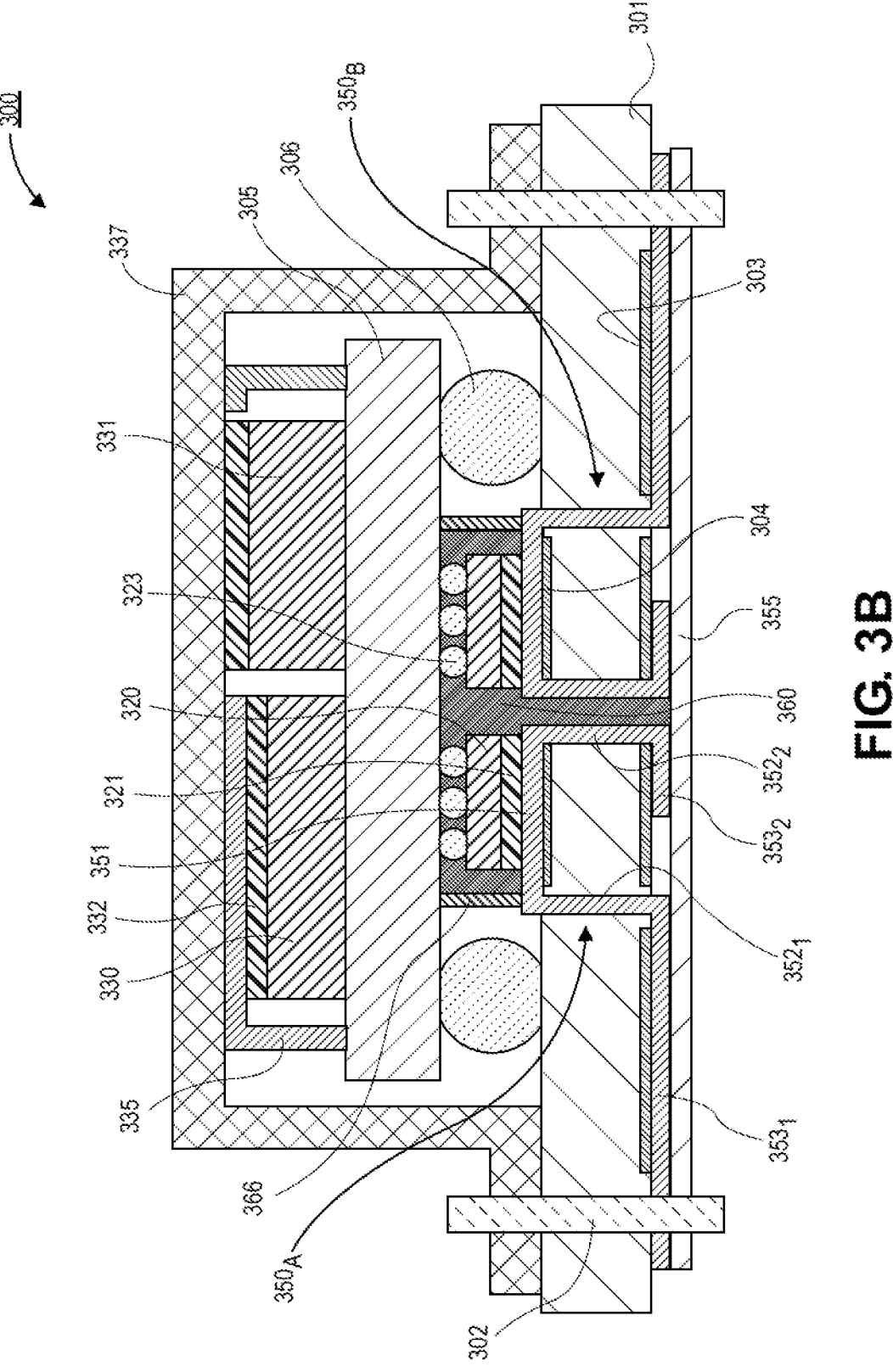
FIG. 3B is a cross-sectional illustration of an electronic system with VR dies between the package substrate and that board that includes a pair of discrete heat spreaders and a liquid thermal interface material (TIM), in accordance with an embodiment.

Referring now to FIG. 3B, a cross-sectional illustration of an electronic system 300 is shown, in accordance with an embodiment. In an embodiment, the electronic system 300 in FIG. 3B may be substantially similar to the electronic system 300 in FIG. 3A, with the exception of the construction of the backside heat spreader 350. Instead of a single backside heat spreader, FIG. 3B includes a pair of backside heat spreaders 350$_A$ and 350$_B$. Additionally, a gap is provided between the heat spreaders 350$_A$ and 350$_B$ in order to allow a liquid TIM 360 to be inserted around the VR dies 320. In the illustrated embodiment, the interconnects 323 are also contacted by the liquid TIM 360. However, it is to be appreciated that a non-conductive underfill may surround the interconnects 323 to protect from shorting.

In an embodiment, each of the heat spreaders 350$_A$ and 350$_B$ may include a first portion 351. A first second portion 352$_1$ and a second second portion 352$_2$ pass vertically through the board 301. The first second portion 352$_1$ is coupled to first third portion 353$_1$, and the second second portion 352$_2$ is coupled to second third portion 353$_2$. The first third portion 353$_1$ and the second third portion 353$_2$ may both be bent in the same direction. The first third portion 353$_1$ may also be longer than the second third portion 353$_2$.

Figure 4A:
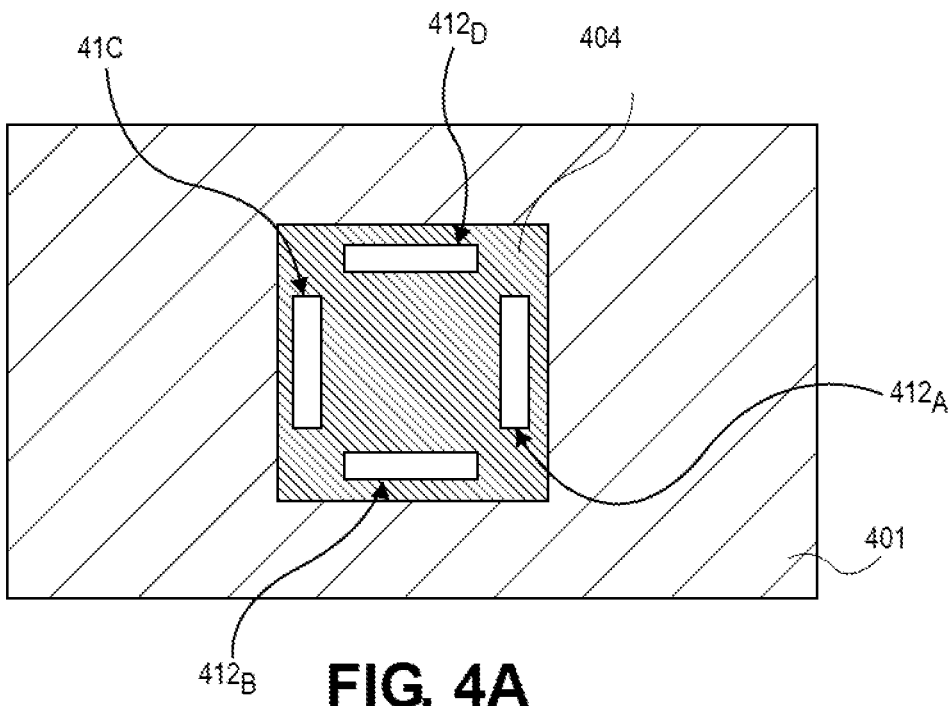
FIG. 4A is a plan view illustration of a board with four slots for integrating with a heat spreader, in accordance with an embodiment.

Referring now to FIG. 4A, a plan view illustration of a board 401 is shown, in accordance with an embodiment. As shown, a metal region 404 may be exposed on the top surface of the board 401. Additionally, a plurality of slots 412$_A$-412$_D$ are provided through a thickness of the board 401. The slots 412 may be formed with a mechanical drilling process or the like. In an embodiment, a first set of slots 412$_A$ and 412$_C$ may be parallel to each other, and a second set of slots 412$_B$ and 412$_D$ may be parallel to each other. In such a configuration, the corresponding heat spreader will have four legs.

Figure 4B:
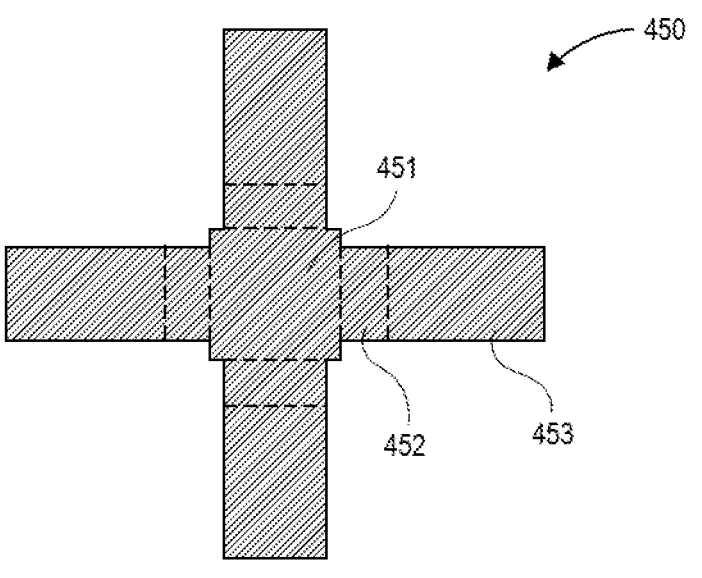
FIG. 4B is a plan view illustration of a heat spreader before being folded, in accordance with an embodiment.

Referring now to FIG. 4B, a plan view illustration of the heat spreader 450 is shown, in accordance with an embodiment. As shown, the heat spreader 450 includes four legs, one for each slot 412 in FIG. 4A. The dashed lines in FIG. 4B indicate where the metal plate will be folded in order to form the heat spreader structure described above. For example, the center square may be the first portion 451, the portion between the inner dashed lines and the outer dashed lines will be folded to be the vertical second portion 452, and the portion outside the outer dashed lines will be folded to be the horizontal third portions 453.

Figure 5A:
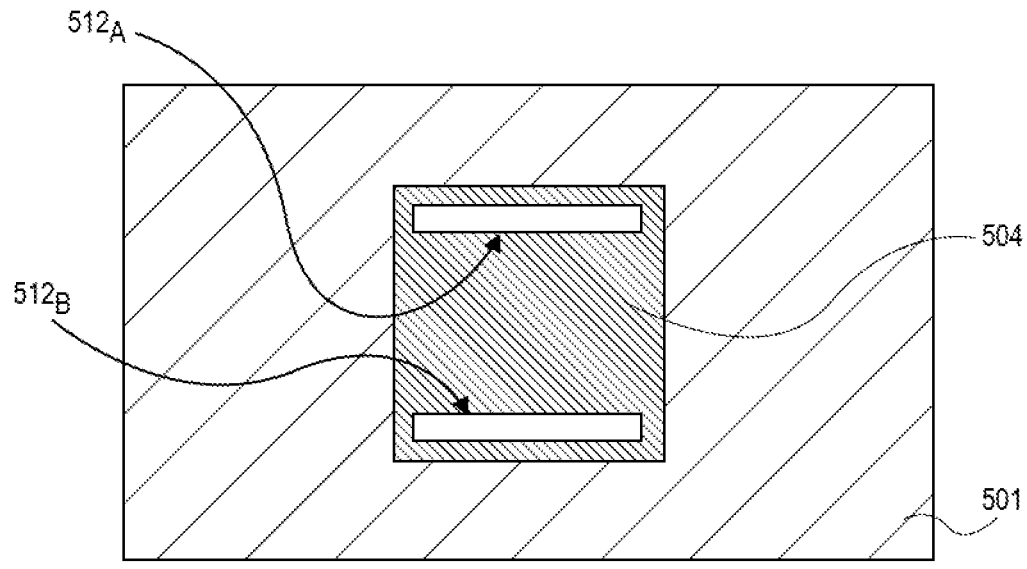
FIG. 5A is a plan view illustration of a board with two slots for integrating with a heat spreader, in accordance with an embodiment.

Referring now to FIG. 5A, a plan view illustration of a board 501 is shown, in accordance with an additional embodiment. As shown, the top metal 504 is exposed, and slots 512$_A$ and 512$_B$ are provided through a thickness of the board 501. The slots 512$_A$ and 512$_B$ may be parallel to each other. Additionally, since only two slots 512 are used, routing through board 501 is not completely blocked off.

Figure 5B:
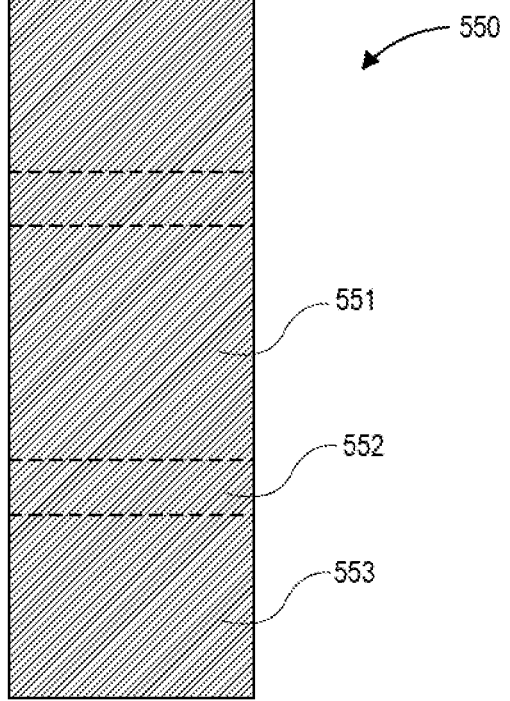
FIG. 5B is a plan view illustration of a heat spreader before being folded, in accordance with an embodiment.

Referring now to FIG. 5B, a plan view illustration of the heat spreader 550 is shown, in accordance with an embodiment. The dashed lines may indicate where folds will be made in order to form a structure similar to those described in greater detail above. For example, a first portion 551 may be at the center of the metal sheet, second portions 552 may be between the dashed lines, and the third portions 553 are provided outside of the dashed lines.

Referring now to FIGS. 6A-6H, a series of cross-sectional illustrations depicting a process for forming an electronic system with a discrete heat spreader is shown, in accordance with an embodiment. In an embodiment, the electronic system assembled in FIGS. 6A-6H may be substantially similar to the electronic system shown in FIG. 3A.

Figures 6A, 6B:
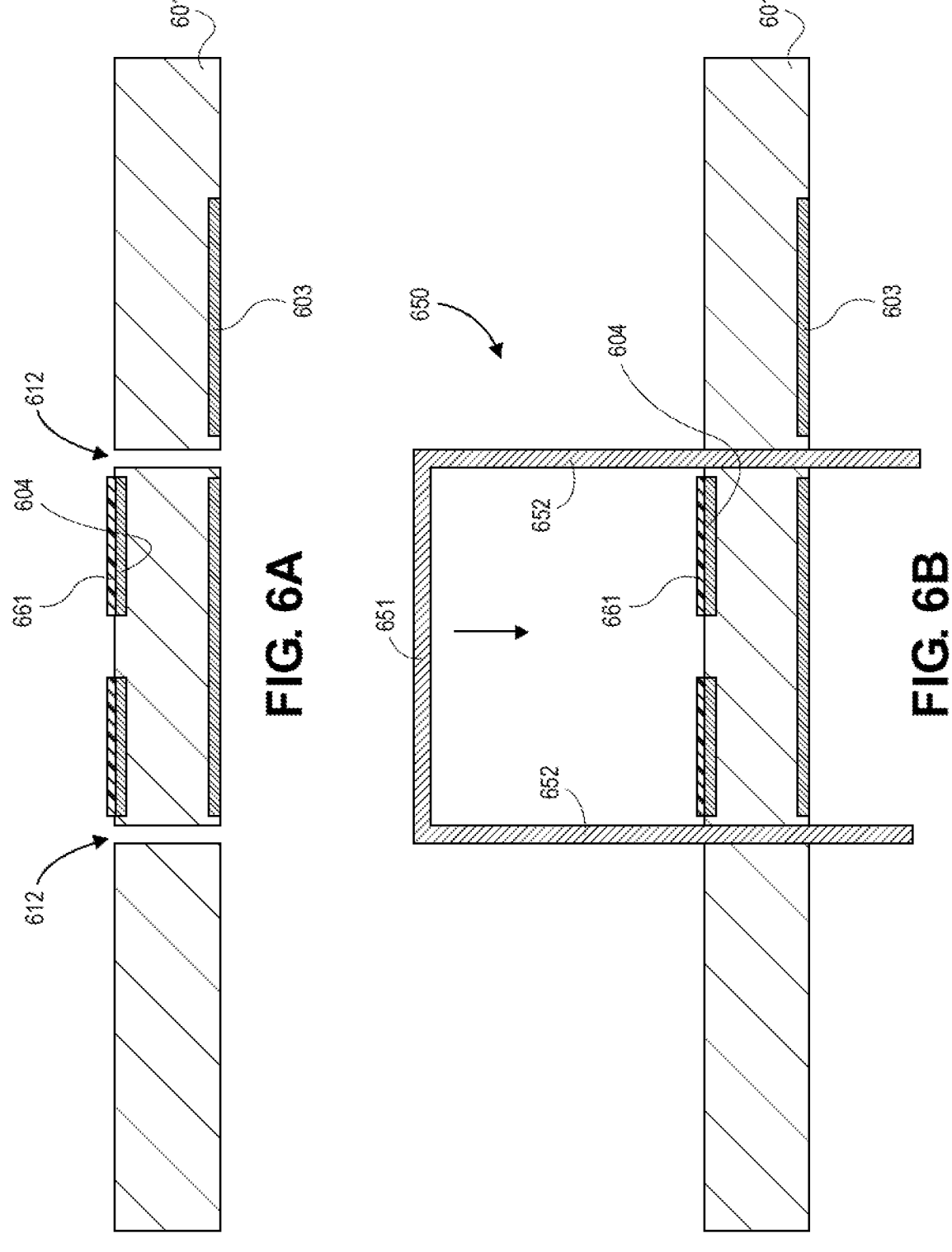
FIG. 6A is a cross-sectional illustration of a board with slots for a heat spreader, in accordance with an embodiment.
FIG. 6B is a cross-sectional illustration of the board with the heat spreader being inserted into the slots, in accordance with an embodiment.

Referring now to FIG. 6A, a cross-sectional illustration of a board 601 is shown, in accordance with an embodiment. In an embodiment, the board 601 may be a PCB or the like. In a particular embodiment, the board 601 may have exposed metal layers 604 and 603 on top and bottom surfaces, respectively. The metal layers 604 and 603 may be configured to be grounded during operation of the electronic system. In an embodiment, a TIM 661 may be provided over the metal layers 604. While not shown, a TIM may also be provided over the metal layers 603 in some embodiments. The TIM 661 will provide improved thermal coupling to the discrete heat spreader that is attached in a subsequent processing operation. In an embodiment, the board 601 may also include one or more slots 612. For example, a pair of slots 612 are shown in FIG. 6A. In other embodiments, additional slots (out of the plane of FIG. 6A) may be included. For example, a four slot 612 board may be included, similar to the embodiment shown in FIG. 4A.

Referring now to FIG. 6B, a cross-sectional illustration of the board 601 during the insertion of the heat spreader 650 into the slots 612 is shown, in accordance with an embodiment. As indicated by the arrow, the heat spreader 650 is inserted down onto the board 601. The heat spreader 650 may include a first portion 651. The first portion may be horizontal and parallel to a top surface of the board 601. Second portions 652 may be vertical and pass through the slots 612.

Figure 6C:
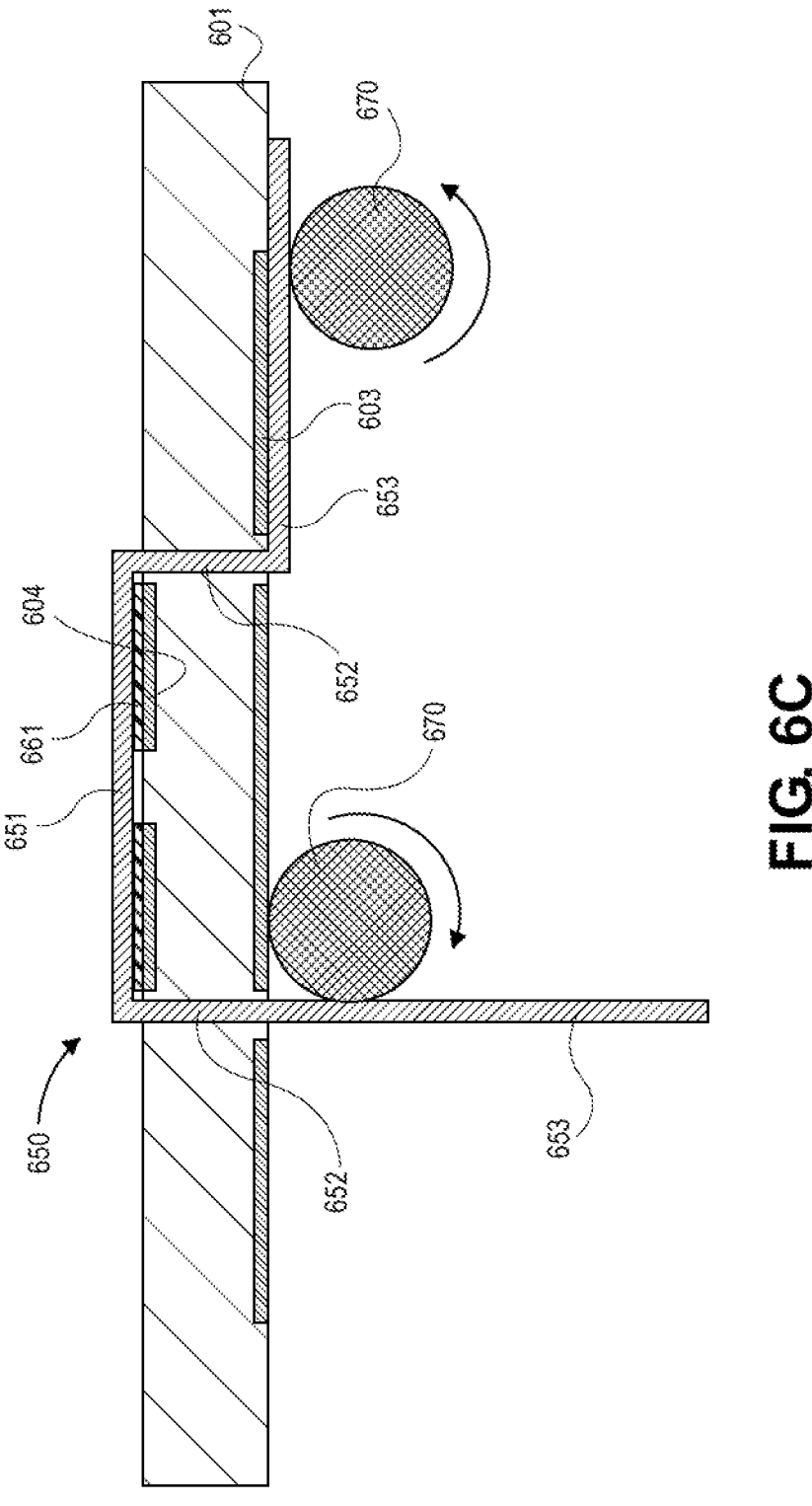
FIG. 6C is a cross-sectional illustration of the board with the bottom portions of the heat spreader being folded over, in accordance with an embodiment.

Referring now to FIG. 6C, a cross-sectional illustration of the board 601 after the heat spreader 650 is fully inserted is shown, in accordance with an embodiment. As shown, the first portion 651 may be in direct contact with the TIM 661 in order to improve thermal coupling to the metal layer 604. The second portions 652 extend through the slots 612 through a thickness of the board 601. After being fully inserted, the third portions 653 may be folded over. For example, a roller 670 or the like may be used to fold over the third portions 653 so that they are parallel to a bottom surface of the board 601. In some embodiments, the third portions 653 may be in direct contact with metal layers 603. In other embodiments, the third portions 653 may be separated from the metal layer 603 by a TIM (not shown).

Figures 6D, 6E:
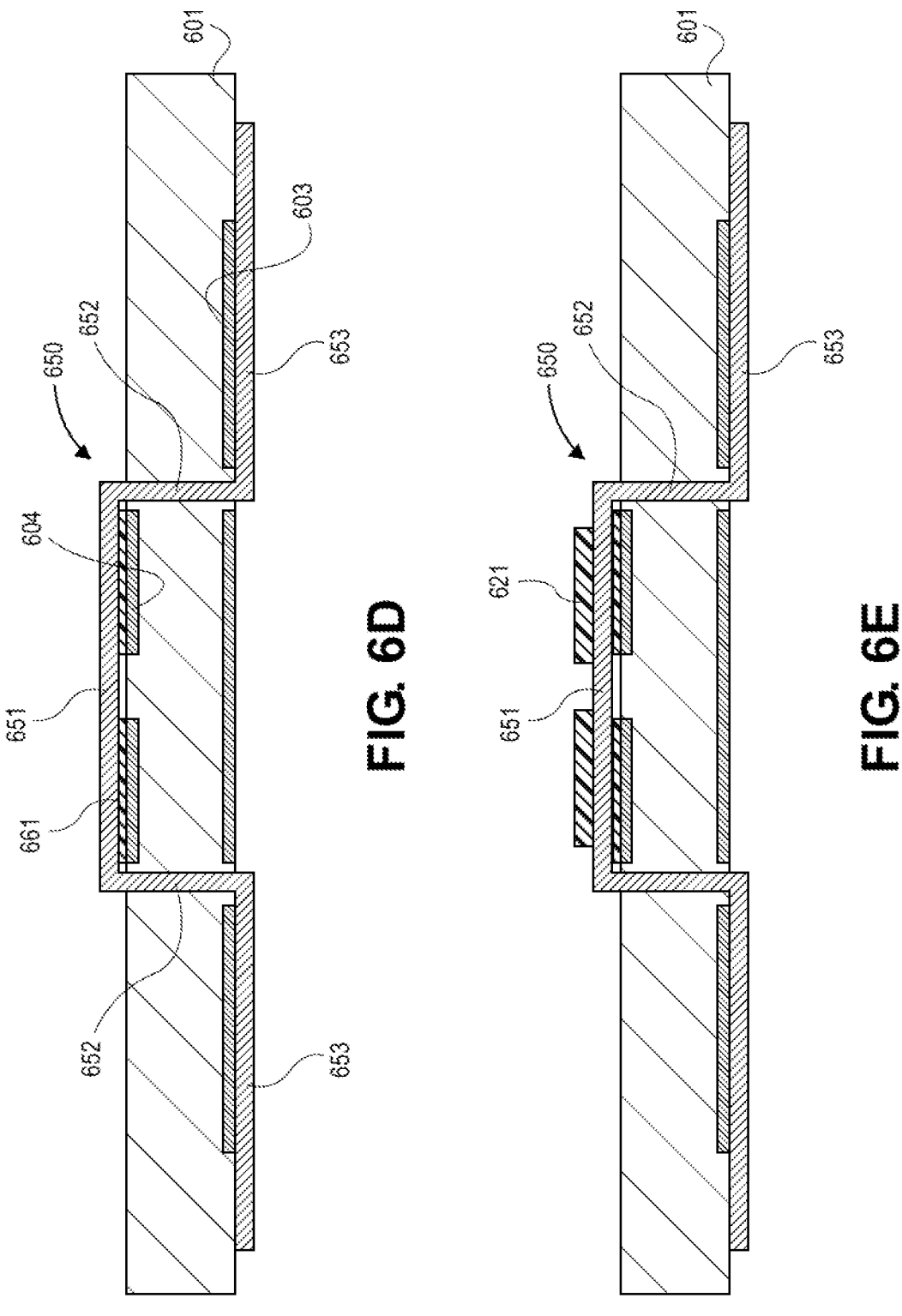
FIG. 6D is a cross-sectional illustration of the board after the bottom portions of the heat spreader are folded over the bottom surface of the board, in accordance with an embodiment.
FIG. 6E is a cross-sectional illustration of the board after a TIM is applied to the top portion of the heat spreader, in accordance with an embodiment.

Referring now to FIG. 6D, a cross-sectional illustration of the board 601 after the heat spreader 650 is folded over is shown, in accordance with an embodiment. As shown, the heat spreader 650 may have a cross-section that is top hat shaped. That is, the heat spreader 650 includes a first horizontal portion (i.e., first portion 651), a pair of vertical portions on each end of the first horizontal portion (i.e., second portions 652), and a pair of horizontal portions at a bottom of the vertical portions (i.e., third portions 653).

Referring now to FIG. 6E, a cross-sectional illustration of the board 601 after a TIM 621 is applied over the first portion 651 of the heat spreader 650 is shown, in accordance with an embodiment. In the illustrated embodiment, two sections of the TIM 621 are shown. Such an embodiment is useful for when there will be two separate VR dies thermally coupled to the heat spreader 650. In an embodiment, each section of the TIM 621 may have a width substantially equal to the width of a VR die. In other embodiments, a single TIM 621 may be used to thermally couple one or more VR dies to the heat spreader 650.

Figure 6F:
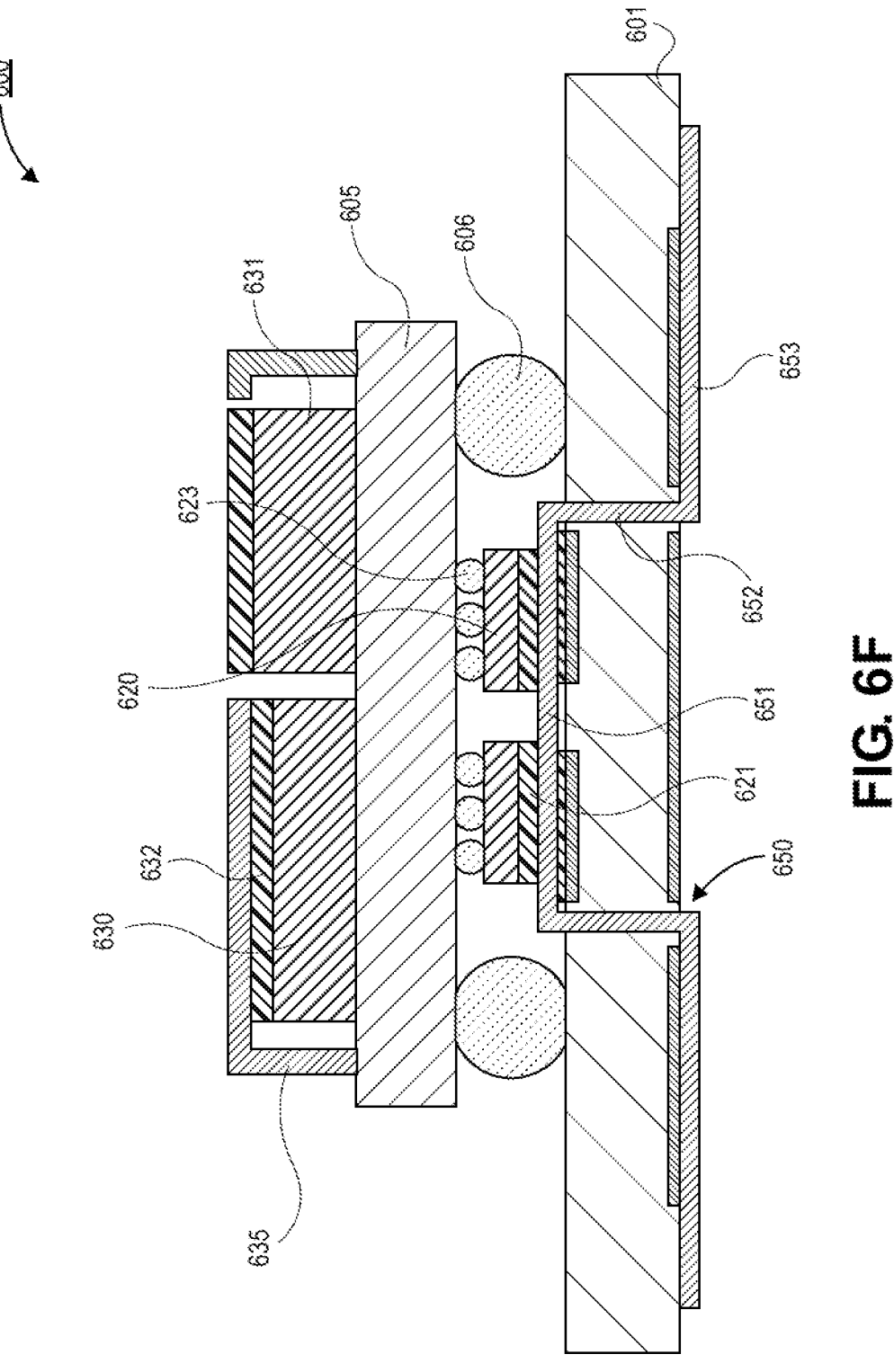
FIG. 6F is a cross-sectional illustration of an electronic system after an electronic package is coupled to the board, in accordance with an embodiment.

Referring now to FIG. 6F, a cross-sectional illustration of an electronic system 600 is shown, in accordance with an embodiment. As shown, an electronic package is coupled to the board 601. For example, a package substrate 605 is coupled to the board 601 by interconnects 606, such as solder balls or the like. A first die 630 and a second die 631 may be provided over the package substrate 605. While two dies 630 and 631 are shown, it is to be appreciated that any number of dies may be provided on the package substrate 605. In a particular embodiment, the first die 630 is a compute die, and the second die 631 is a memory die. In an embodiment, TIM 632 may be provided over the dies 630 and 631. A heat spreader 635 may also be provided over the dies 630 and 631 in some embodiments.

As shown, a pair of VR dies 620 are provided under the package substrate 605 between the package substrate 605 and the board 601. While referred to as VR dies, it is to be appreciated that dies 620 may be any type of die that is provided between the package substrate 605 and the board 601. In an embodiment, two VR dies 620 are shown. In other embodiments, there may be one or more VR dies 620. The VR dies 620 may be coupled to the package substrate 605 by interconnects 623, such as solder balls or the like. In an embodiment, the backside surfaces of the VR dies 620 may be in direct contact with the TIM 621. Accordingly, the VR dies 620 are thermally coupled to the heat spreader 650.

Figure 6G:
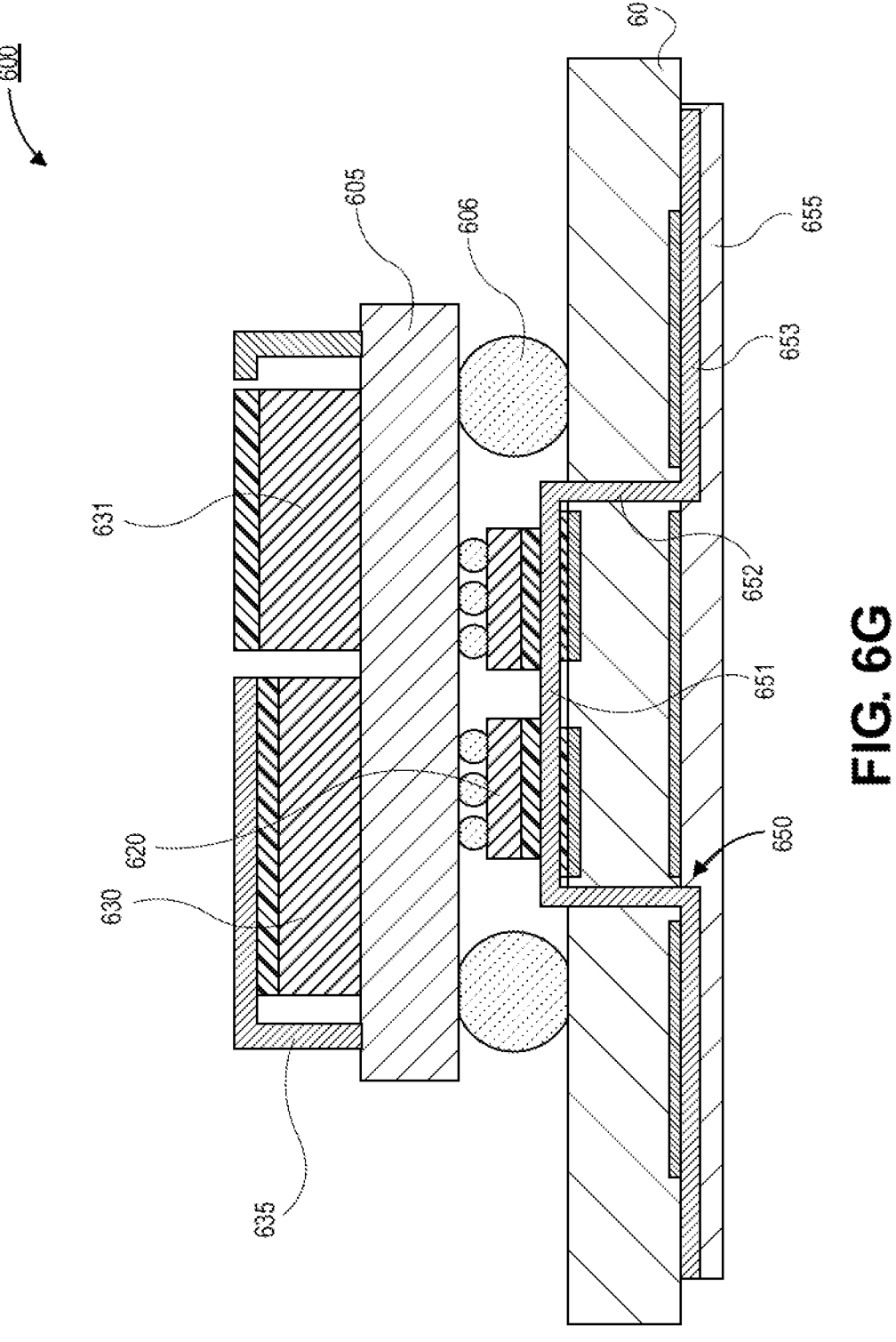
FIG. 6G is a cross-sectional illustration of the electronic system after a graphite layer is disposed over the backside surface of the board, in accordance with an embodiment.

Referring now to FIG. 6G, a cross-sectional illustration of the electronic system 600 after a back plate 655 is provided over a backside surface of the board 601 is shown, in accordance with an embodiment. In an embodiment, the back plate 655 may be a material that enhances the heat spreading of the heat spreader 650. For example, the back plate 655 may include graphite or the like.

Figure 6H:
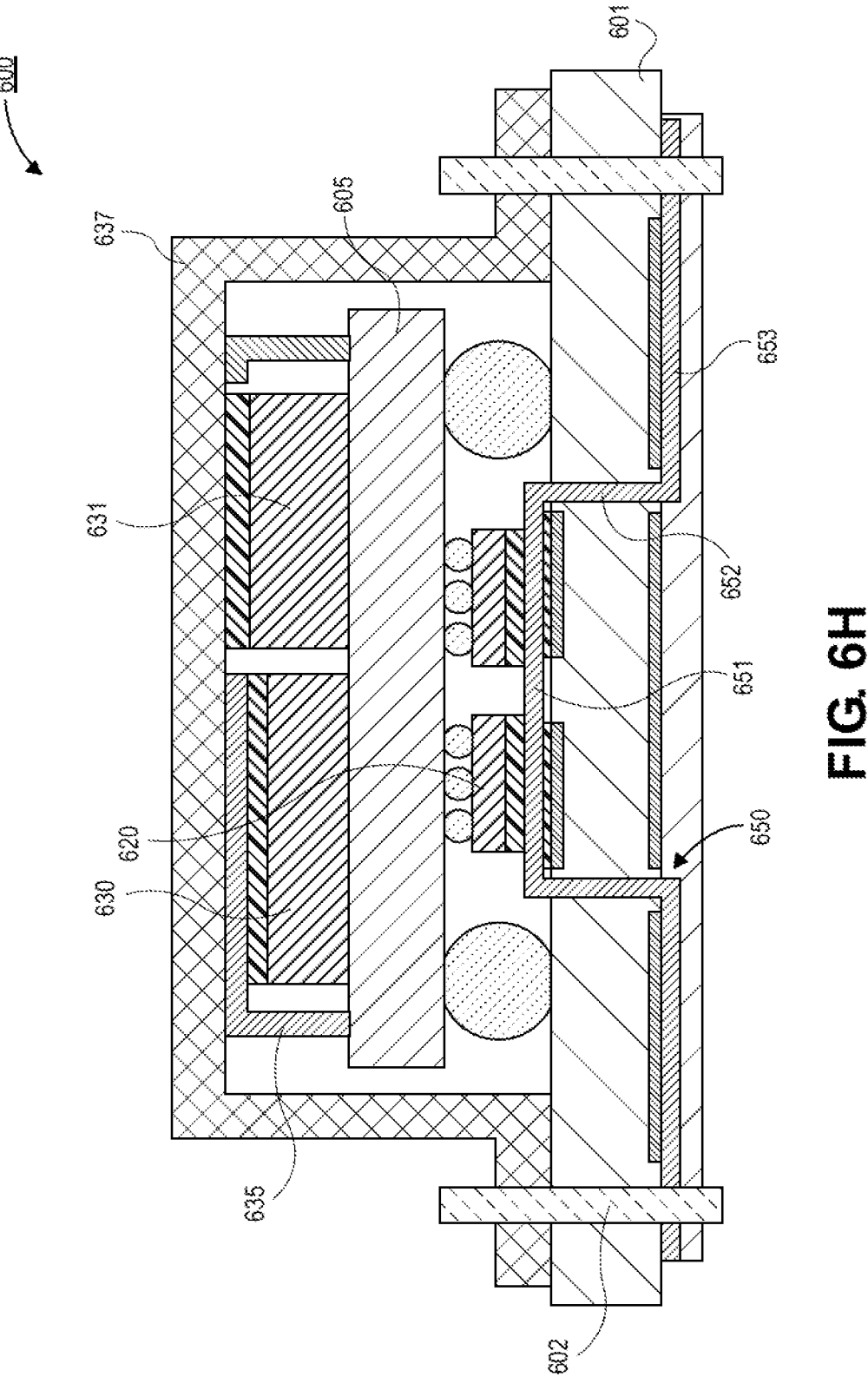
FIG. 6H is a cross-sectional illustration of the electronic system after a thermal solution is provided over the electronic package, in accordance with an embodiment.

Referring now to FIG. 6H, a cross-sectional illustration of the electronic system 600 after a thermal solution 637 is provided over the front side of the electronic system 600 is shown, in accordance with an embodiment. In an embodiment, the thermal solution 637 may be a heat sink or the like. The thermal solution 637, the heat spreader 650, and the back plate 655 may be coupled to the board 601 by pins 602 (e.g., screws, bolts, or any other fastener mechanism).

Referring now to FIGS. 7A-7I, a series of cross-sectional illustrations depicting a process for forming an electronic system is shown, in accordance with an embodiment. In an embodiment, the electronic system in FIGS. 7A-7I may be substantially similar to the electronic system 300 shown in FIG. 3B. That is, a pair of heat spreaders with a liquid TIM may be included in the electronic system.

Figures 7A, 7B:
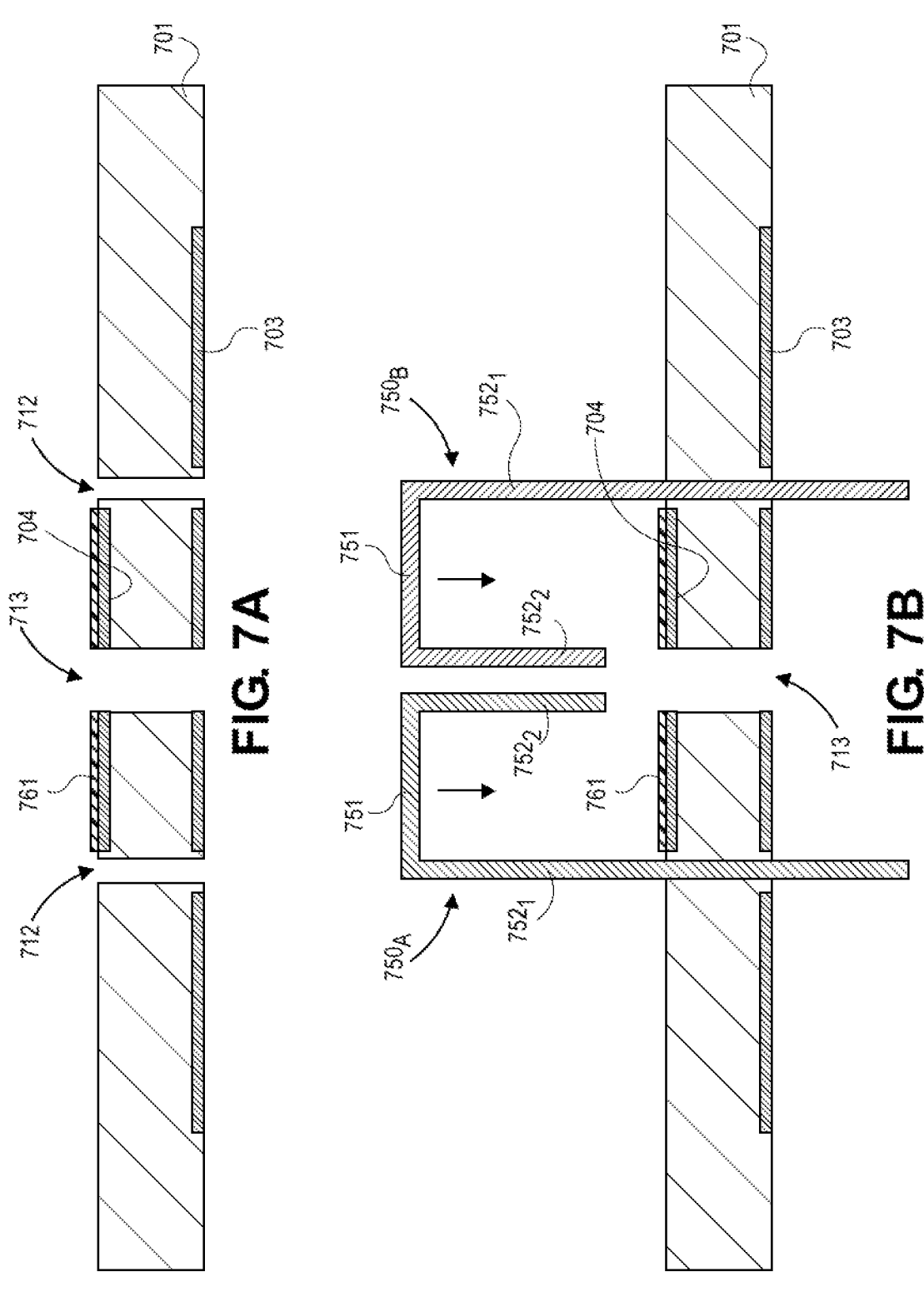
FIG. 7A is a cross-sectional illustration of a board with slots for a pair of heat spreaders, in accordance with an embodiment.
FIG. 7B is a cross-sectional illustration of the board with the heat spreaders being inserted in the slots, in accordance with an embodiment.

Referring now to FIG. 7A, a cross-sectional illustration of a board 701 is shown, in accordance with an embodiment. In an embodiment, the board 701 may be a PCB or the like. In a particular embodiment, the board 701 may have exposed metal layers 704 and 703 on top and bottom surfaces, respectively. The metal layers 704 and 703 may be configured to be grounded during operation of the electronic system. In an embodiment, a TIM 761 may be provided over the metal layers 704. While not shown, a TIM may also be provided over the metal layers 703 in some embodiments. The TIM 761 will provide improved thermal coupling to the discrete heat spreader that is attached in a subsequent processing operation. In an embodiment, the board 701 may also include one or more slots 712. For example, a pair of slots 712 are shown in FIG. 7A. An additional slot 713 may be provided between the slots 712. The slot 713 may be wider than the slots 712. The additional width of the slot 713 allows for two heat spreaders to be inserted while also providing room to insert a liquid TIM.

Referring now to FIG. 7B, a cross-sectional illustration of the board 701 while heat spreaders 750$_A$ and 750$_B$ are inserted into the slots 712 and 713 is shown. As indicated by the arrows, the heat spreaders 750$_A$ and 750$_B$ are brought towards the board 701 so that the second portions 752$_1$ and 752$_2$ are inserted into the slots 712 and 713. The second portions 752$_1$ may be inserted into slots 712, and the second portions 752$_2$ may be inserted into the slot 713. The second portions 752$_1$ and 752$_2$ may be coupled together by first portion 751.

Figures 7C, 7D:
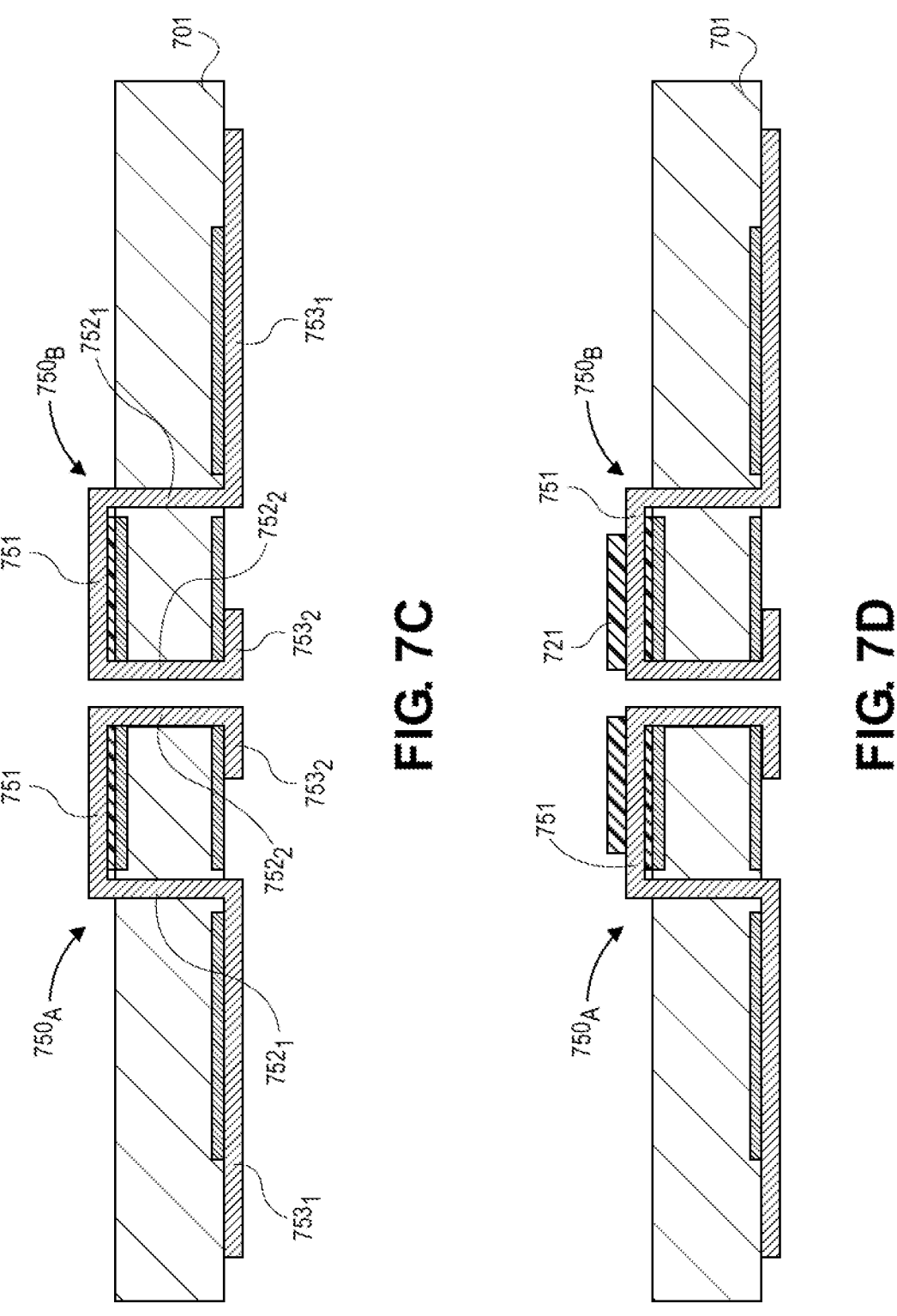
FIG. 7C is a cross-sectional illustration of the board after the backside portions of the heat spreaders are folded over the backside of the board, in accordance with an embodiment.
FIG. 7D is a cross-sectional illustration of the board after a TIM is applied over the front side surfaces of the heat spreaders, in accordance with an embodiment.

Referring now to FIG. 7C, a cross-sectional illustration of the board 701 after the heat spreaders 750 are fully inserted and the third portions 753$_1$ and 753$_2$ are folded over is shown, in accordance with an embodiment. As shown, the third portions 753 are folded over in the same direction. For example, in heat spreader 750$_A$ the third portions 753$_1$ and 753$_2$ are bent to the left, and in heat spreader 750$_B$ the third portions 753$_1$ and 753$_2$ are bent to the right.

Referring now to FIG. 7D, a cross-sectional illustration of the board 701 after a TIM 721 is applied over the heat spreaders 750 is shown, in accordance with an embodiment. As shown, a pair of TIMs 721 are provided over the board 701, one over each of the heat spreaders 750. The TIM 721 allows for improved thermal coupling to the subsequently added VR dies.

Figures 7E, 7F:
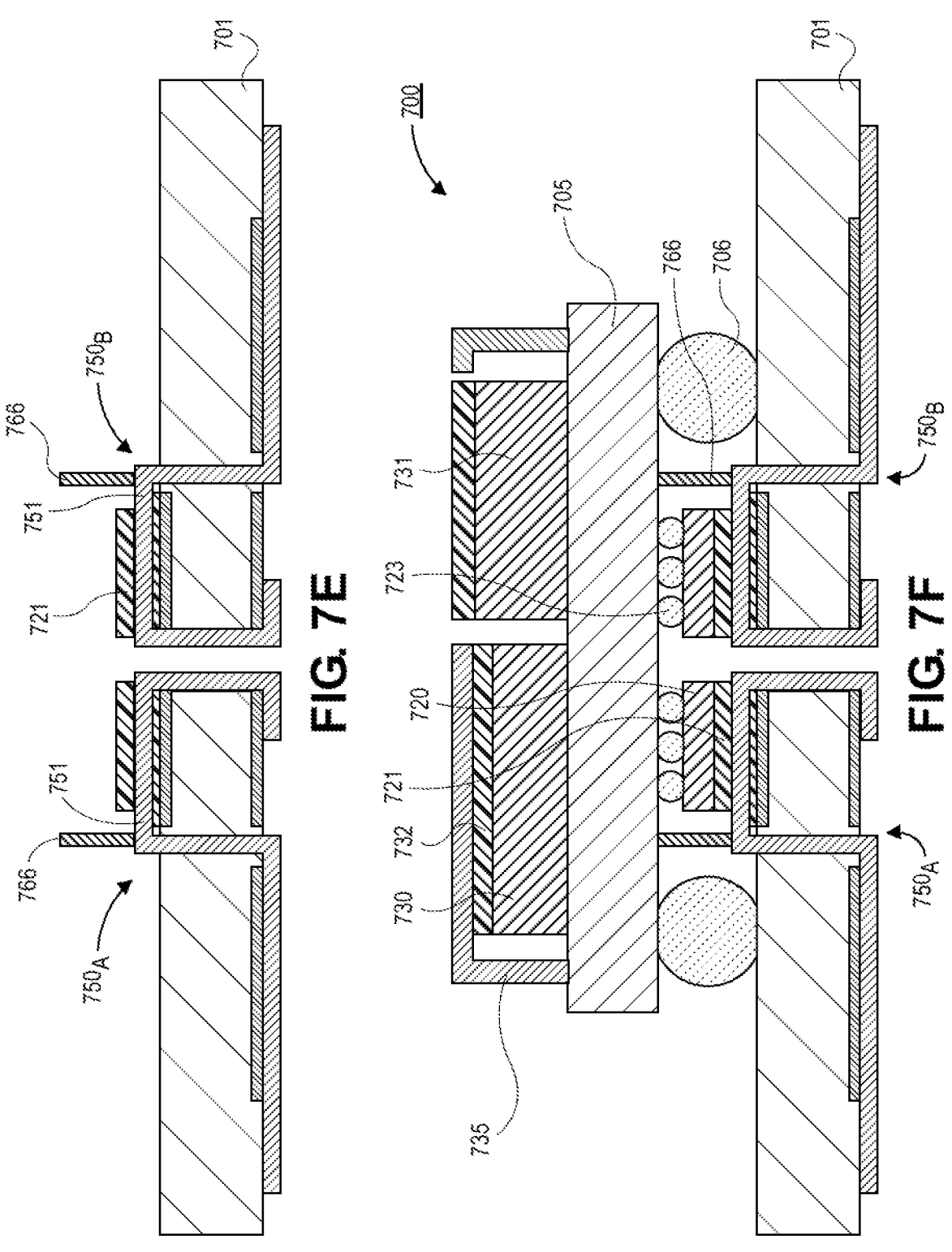
FIG. 7E is a cross-sectional illustration of the board after a gasket is applied to the top surfaces of the heat spreaders, in accordance with an embodiment.
FIG. 7F is a cross-sectional illustration of an electronic system after an electronic package with VR dies is coupled to the heat spreaders, in accordance with an embodiment.

Referring now to FIG. 7E, a cross-sectional illustration of the board 701 after a gasket 766 is provided on the heat spreaders 750$_A$ and 750$_B$. The gasket 766 is used to contain a subsequently deposited liquid TIM. The gasket 766 may be a conformal material, such as a polymer or the like.

Referring now to FIG. 7F, a cross-sectional illustration of an electronic system 700 is shown, in accordance with an embodiment. As shown, an electronic package is coupled to the board 701. For example, a package substrate 705 is coupled to the board 701 by interconnects 706, such as solder balls or the like. A first die 730 and a second die 731 may be provided over the package substrate 705. While two dies 730 and 731 are shown, it is to be appreciated that any number of dies may be provided on the package substrate 705. In a particular embodiment, the first die 730 is a compute die, and the second die 731 is a memory die. In an embodiment, TIM 732 may be provided over the dies 730 and 731. A heat spreader 735 may also be provided over the dies 730 and 731 in some embodiments.

As shown, a pair of VR dies 720 are provided under the package substrate 705 between the package substrate 705 and the board 701. While referred to as VR dies, it is to be appreciated that dies 720 may be any type of die that is provided between the package substrate 705 and the board 701. In an embodiment, two VR dies 720 are shown. In other embodiments, there may be one or more VR dies 720. The VR dies 720 may be coupled to the package substrate 705 by interconnects 723, such as solder balls or the like. In an embodiment, the backside surfaces of the VR dies 720 may be in direct contact with the TIM 721. Accordingly, the VR dies 720 are thermally coupled to the heat spreader 750.

Figure 7G:
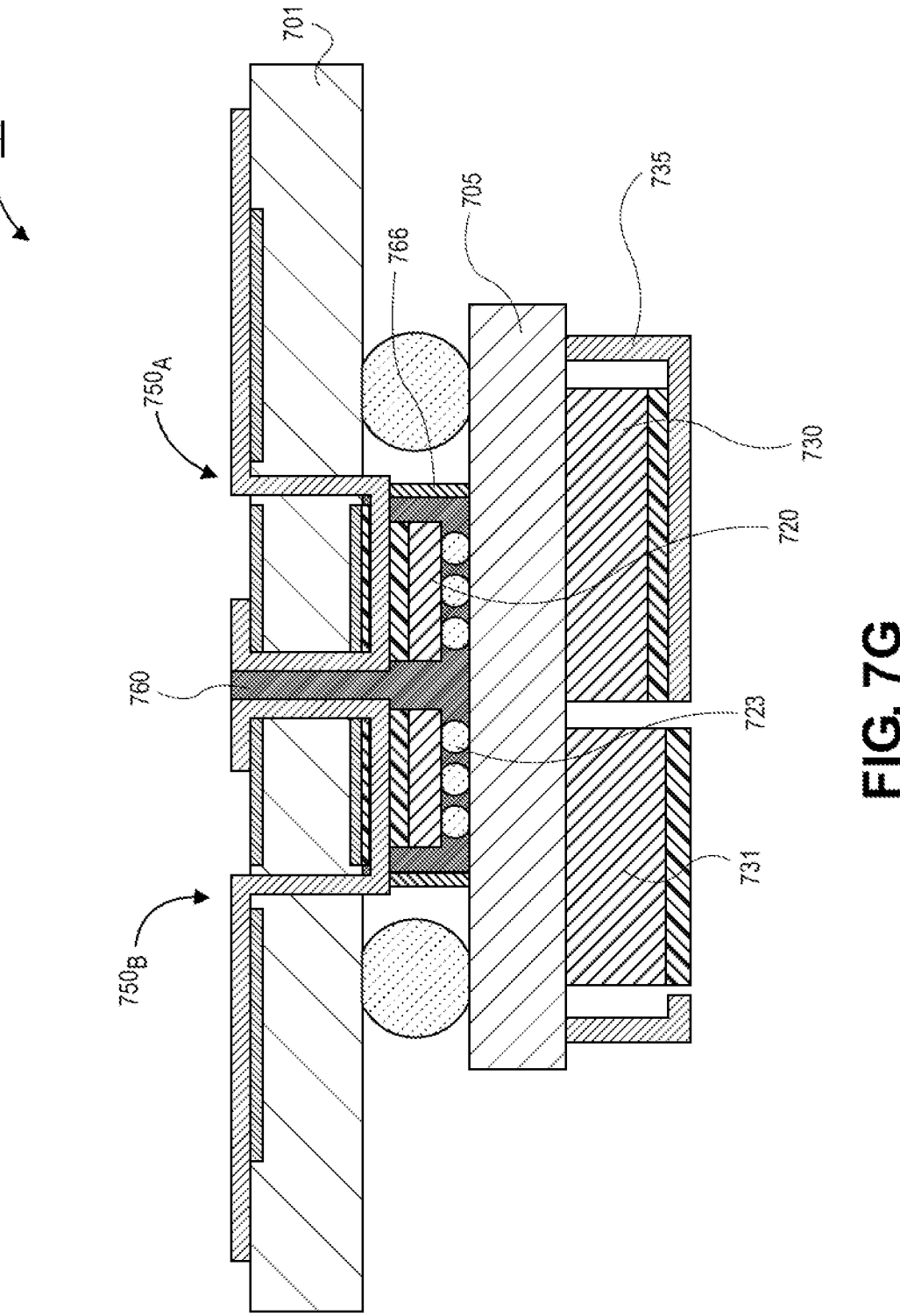
FIG. 7G is a cross-sectional illustration of the electronic system after a liquid TIM is inserted between the heat spreaders, in accordance with an embodiment.

Referring now to FIG. 7G, a cross-sectional illustration of the electronic system 700 after it is flipped over an a liquid TIM 760 is dispensed between the heat spreaders 750$_A$ and 750$_B$. The flow of the liquid TIM 760 is constrained by the gaskets 766 which are provided between the heat spreaders 750 and the package substrate 705. While shown as contacting the interconnects 723, it is to be appreciated that a non-conductive underfill or the like may surround the interconnects 723 in some embodiments. The use of the liquid TIM 760 further improves the heat extraction from the VR dies 720.

Figure 7H:
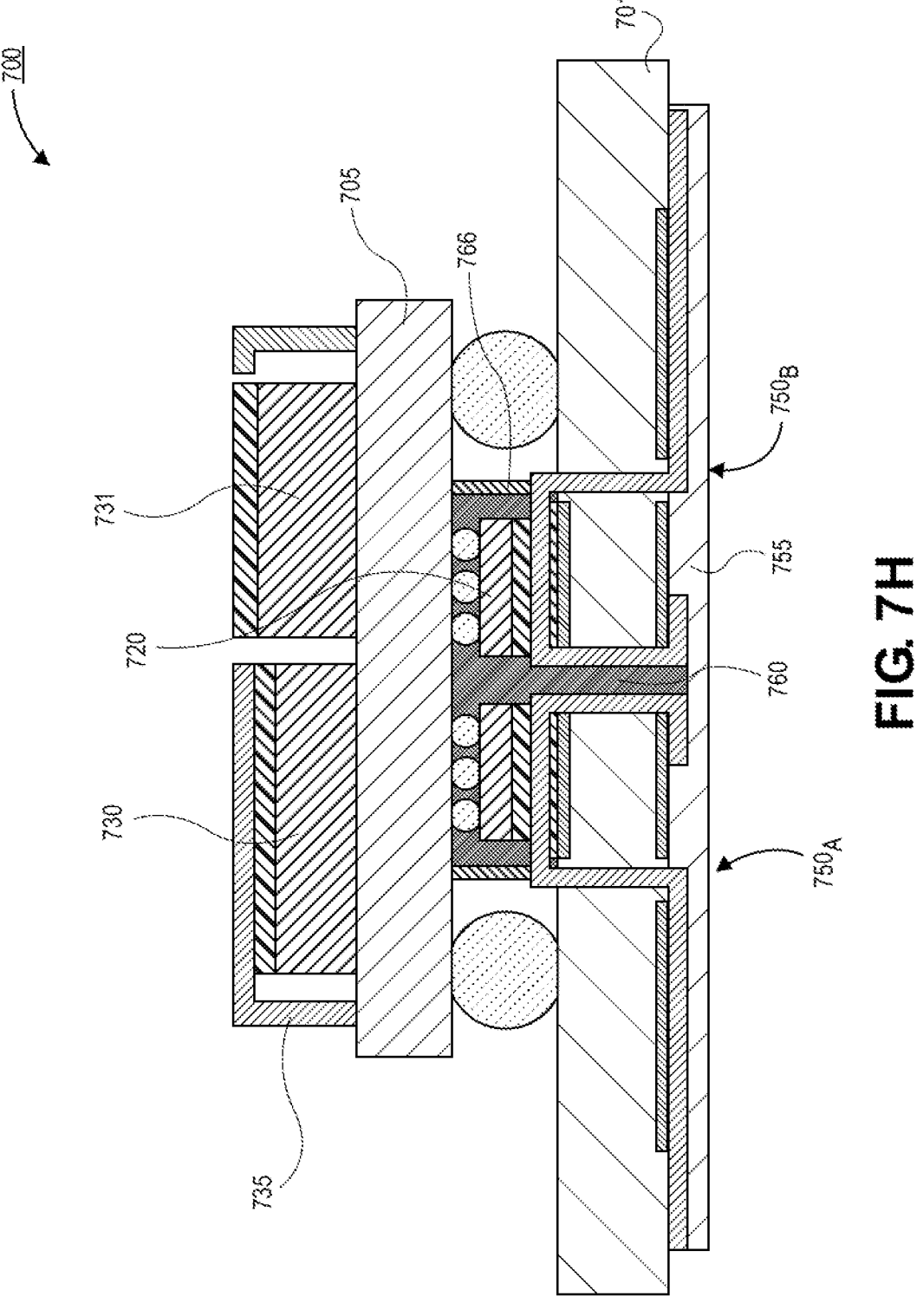
FIG. 7H is a cross-sectional illustration of the electronic system after a graphite layer is provided on the backside surface of the board, in accordance with an embodiment.

Referring now to FIG. 7H, a cross-sectional illustration of the electronic system 700 after a back plate 755 is added over the backside surface of the board 701. In an embodiment, the back plate 755 confines the liquid TIM 760. The back plate 755 may also enhance the heat spreading of the heat spreaders 750. For example, the back plate 755 may be graphite or the like.

Figure 7I:
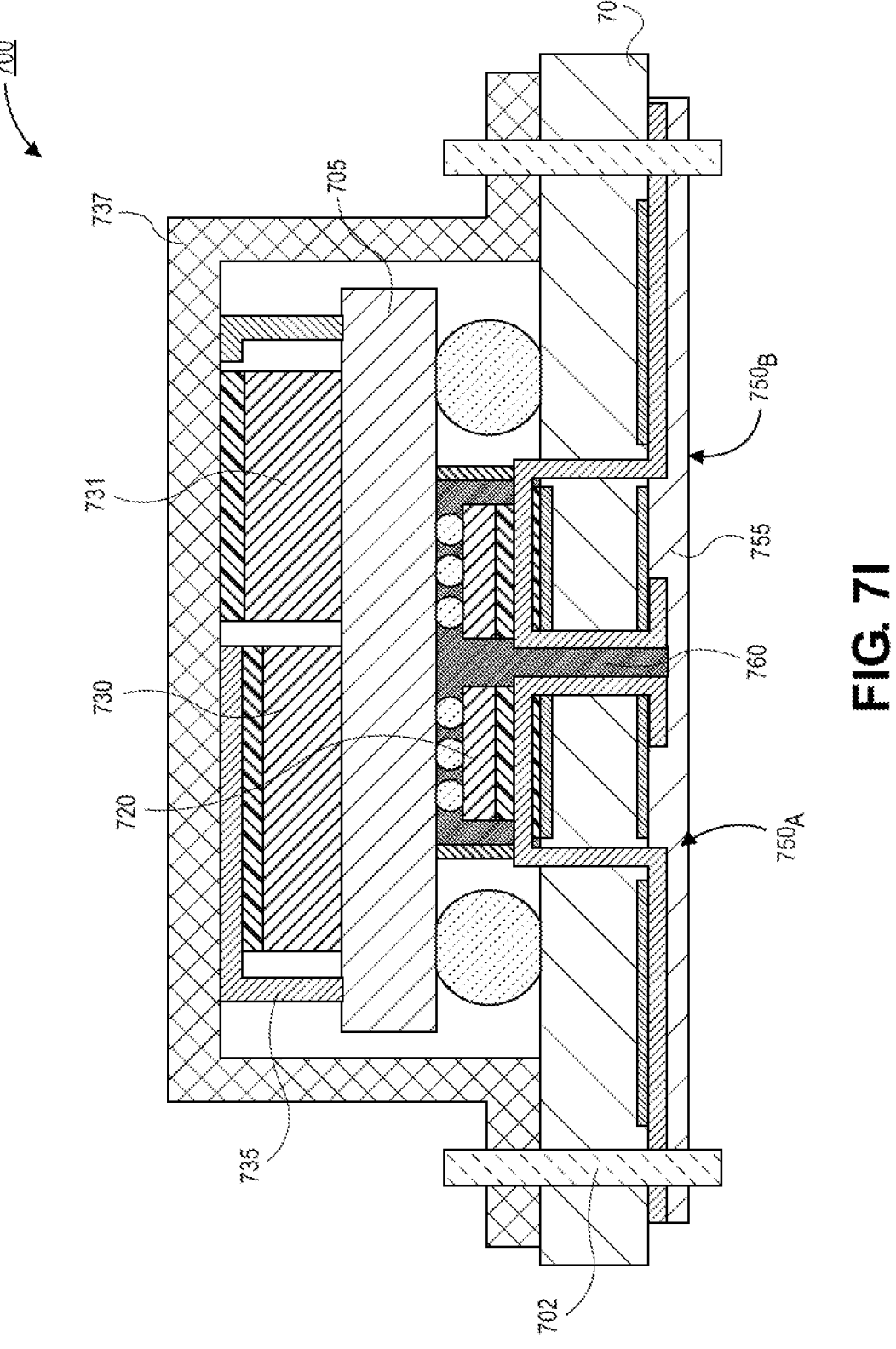
FIG. 7I is a cross-sectional illustration of the electronic system after a thermal solution is attached to the electronic package, in accordance with an embodiment.

Referring now to FIG. 7I, a cross-sectional illustration of the electronic system after a thermal solution 737 is provided over the front side of the electronic system 700 is shown, in accordance with an embodiment. In an embodiment, the thermal solution 737 may be a heat sink or the like. The thermal solution 737, the heat spreaders 750$_A$ and 750$_B$, and the back plate 755 may be coupled to the board 701 by pins 702 (e.g., screws, bolts, or any other fastener mechanism).

Figure 8:
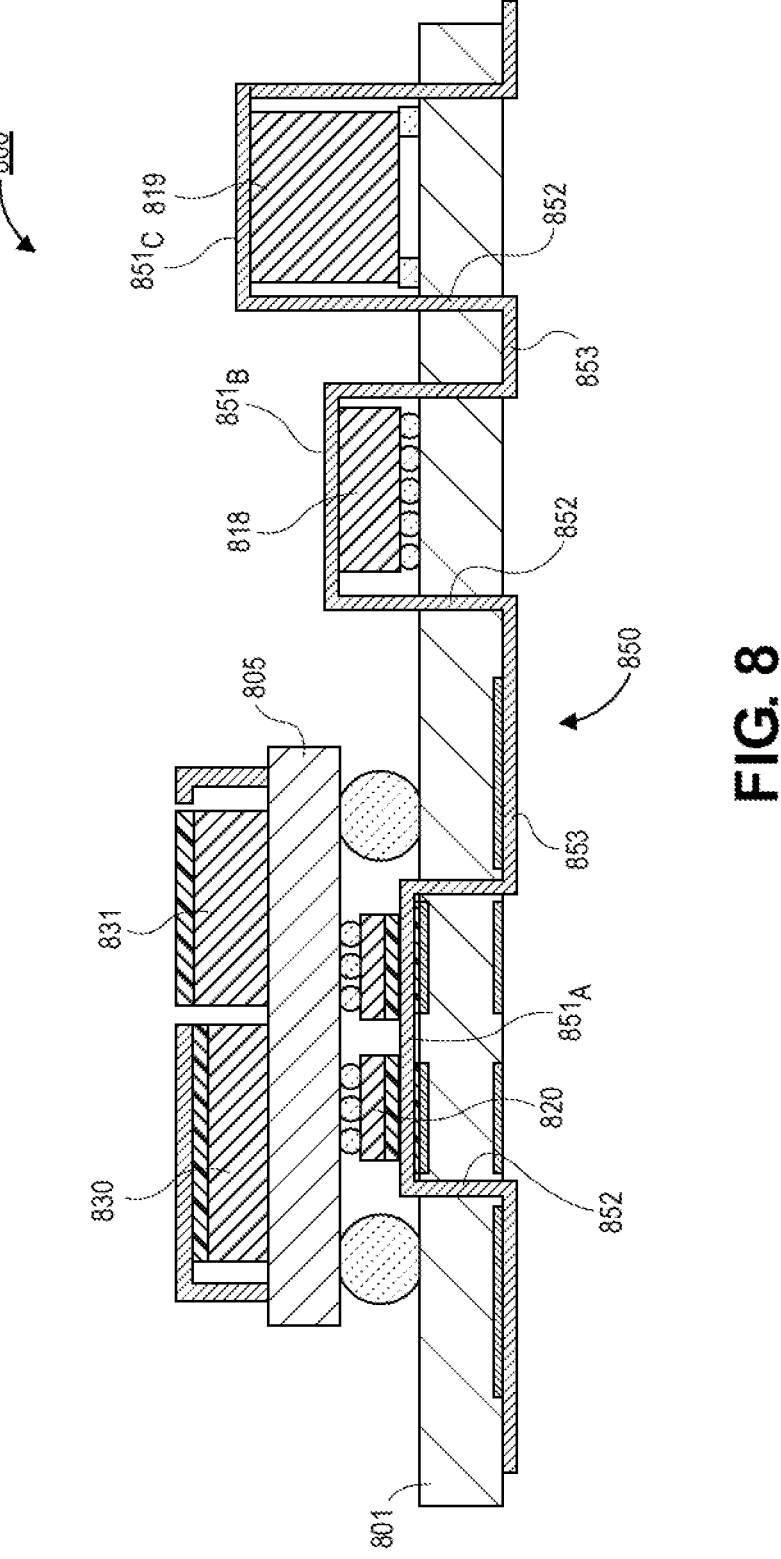
FIG. 8 is a cross-sectional illustration of an electronic system with a heat spreader that is woven through the board around a plurality of heat sources, in accordance with an embodiment.

Referring now to FIG. 8, a cross-sectional illustration of an electronic system is shown, in accordance with an additional embodiment. In an embodiment, the electronic system includes a package substrate 805 with dies 830 and 831 on the package substrate 805. In an embodiment, VR dies 820 are provided between the package substrate 805 and the board 801. In an embodiment, additional heat sources 818 and 819 are also provided on the board 801. For example, the heat sources 818 and 819 may include dies (e.g., MOSFET devices, inductors, or any other passive or active component).

Instead of having a heat spreader 850 that is coupled to a single structure, the heat spreader 850 may be woven through the board 801. For example, a braided copper material may be used in order to weave the heat spreader up and down through the board. For example, a first first portion 851$_A$ may be thermally coupled to VR dies 820, a second first portion 851$_B$ may be thermally coupled to heat source 818, and a third first portion 851$_C$ may be thermally coupled to heat source 819. As shown, vertical second portions 852 may pass through slots in the board 801, and third portions 853 may be provided on a backside of the board 801. The weaving pattern may be particularly beneficial because the heat spreader 850 will not require additional mounting features, such as screws or adhesives. In some embodiments, the two edges of the heat spreader may be coupled to the board 801.

Figure 9:
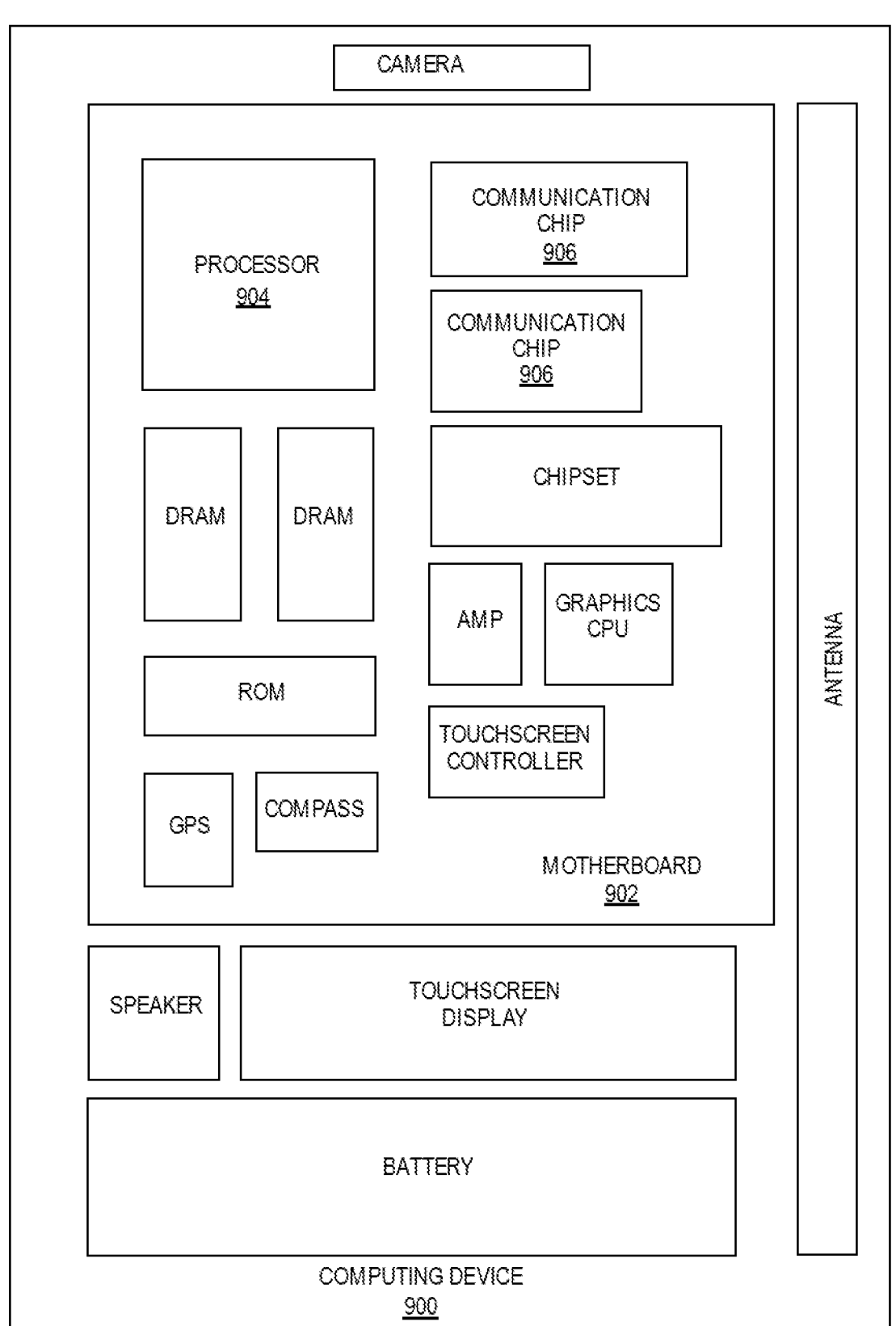
FIG. 9 is a schematic of a computing device built in accordance with an embodiment.

FIG. 9 illustrates a computing device 900 in accordance with one implementation of the invention. The computing device 900 houses a board 902. The board 902 may include a number of components, including but not limited to a processor 904 and at least one communication chip 906. The processor 904 is physically and electrically coupled to the board 902. In some implementations the at least one communication chip 906 is also physically and electrically coupled to the board 902. In further implementations, the communication chip 906 is part of the processor 904.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 906 enables wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 906 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 900 may include a plurality of communication chips 906. For instance, a first communication chip 906 may be dedicated to shorter range wireless communications such as Wi-Fi and Bluetooth and a second communication chip 906 may be dedicated to longer range wireless communications such as GPS, EDGE, GPRS, CDMA, WiMAX, LTE, Ev-DO, and others.

The processor 904 of the computing device 900 includes an integrated circuit die packaged within the processor 904. In some implementations of the invention, the integrated circuit die of the processor may be part of an electronic system that includes a discrete heat spreader that is inserted through slots in a board, in accordance with embodiments described herein. The term "processor" may refer to any device or portion of a device that processes electronic data from registers and/or memory to transform that electronic data into other electronic data that may be stored in registers and/or memory.

The communication chip 906 also includes an integrated circuit die packaged within the communication chip 906. In accordance with another implementation of the invention, the integrated circuit die of the communication chip may be part of an electronic system that includes a discrete heat spreader that is inserted through slots in a board, in accordance with embodiments described herein.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: a printed circuit board (PCB), comprising: a substrate with a first surface and a second surface opposite from the first surface; a first slot through a thickness of the substrate; a second slot through the thickness of the substrate, wherein the first slot is parallel to the second slot; and a metal plate, wherein the metal plate comprises: a first portion over the first surface of the substrate between the first slot and the second slot; a second portion connected to the first portion, wherein the second portion is in the first slot; and a third portion connected to the first portion, wherein the third portion is in the second slot.

Example 2: the PCB of Example 1, wherein the first portion of the metal plate is thermally coupled to a conductive layer exposed on the first surface of the substrate.

Example 3: the PCB of Example 1 or Example 2, wherein the metal plate further comprises: a fourth portion connected to the second portion, wherein the fourth portion contacts the second surface of the substrate; and a fifth portion connected to the third portion, wherein the fifth portion contacts the second surface of the substrate.

Example 4: the PCB of Example 3, wherein the metal plate has a top hat shaped cross-section.

Example 5: the PCB of Example 3 or Example 4, wherein the fourth portion and the fifth portion contact metal exposed on the second surface of the substrate.

Example 6: the PCB of Example 5, wherein the metal exposed on the second surface of the substrate is configured to be grounded.

Example 7: the PCB of Examples 3-6, further comprising: a graphite layer on the fourth portion and the fifth portion.

Example 8: the PCB of Examples 1-7, further comprising: a third slot through the substrate; and a second metal plate, wherein the second metal plate comprises: a fourth portion on the first surface of the substrate between the second slot and the third slot; a fifth portion connected to the fourth portion, wherein the fifth portion is in the second slot; and a sixth portion connected to the fourth portion, wherein the sixth portion is in the third slot.

Example 9: the PCB of Examples 1-8, further comprising: a third slot through the substrate; a fourth slot through the substrate, wherein the fourth slot is parallel to the third slot.

Example 10: the PCB of Example 9, wherein the metal plate further comprising: a fourth portion connected to the first portion, wherein the fourth portion is in the third slot; and a fifth portion connected to the first portion, wherein the fifth portion is in the fourth slot.

Example 11: the PCB of Examples 1-10, wherein the metal plate comprises copper.

Example 12: an electronic system, comprising: a printed circuit board (PCB) with a first surface and a second surface opposite from the first surface, wherein slots extend through a thickness of the PCB; a heat spreader inserted through the slots of the PCB, wherein a bottom portion of the heat spreader is folded against the second surface of the PCB; an electronic package coupled to the PCB, wherein the electronic package comprises: a die between a package substrate and the PCB, and wherein the die is thermally coupled to the heat spreader by a thermal interface material (TIM).

Example 13: the electronic system of Example 12, wherein the heat spreader has a top hat shaped cross-section.

Example 14: the electronic system of Example 12 or Example 13, further comprising: a second heat spreader inserted through the slots of the PCB, wherein a bottom portion of the heat spreader is folded against the second surface of the PCB, and wherein the second heat spreader and the heat spreader share one of the slots.

Example 15: the electronic system of Example 14, further comprising: a gasket around the die between the package substrate and the PCB.

Example 16: the electronic system of Example 15, further comprising: a liquid TIM disposed around the die and into the shared slot.

Example 17: the electronic system of Examples 12-16, further comprising: a graphite layer on the bottom portion of the heat spreader.

Example 18: the electronic system of Examples 12-17, further comprising: a second die on the package substrate opposite from the die; and a second heat spreader coupled to the second die.

Example 19: the electronic system of Examples 12-18, wherein two parallel slots extend through the PCB.

Example 20: the electronic system of Examples 12-19, wherein four slots extend through the PCB, where a first set of slots are parallel to each other and a second set of slots are parallel to each other.

Example 21: the electronic system of Examples 12-20, wherein the heat spreader comprises copper.

Example 22: the electronic system of Examples 12-21, wherein the bottom portion of the heat spreader contacts a metal on the second surface of the PCB.

Example 23: an electronic system, comprising: a printed circuit board (PCB), comprising: a substrate with a first surface and a second surface opposite from the first surface; a first slot through a thickness of the substrate; a second slot through the thickness of the substrate, wherein the first slot is parallel to the second slot; and a heat spreader, wherein the heat spreader comprises: a first portion over the first surface of the substrate between the first slot and the second slot; a first leg connected to the first portion, wherein the first leg is in the first slot; and a second leg connected to the first portion, wherein the second leg is in the second slot; and an electronic package coupled to the PCB, wherein the electronic package comprises: a voltage regulator (VR) die between a package substrate and the PCB, and wherein the VR die is thermally coupled to the first portion of the metal plate by a thermal interface material (TIM).

Example 24: the electronic system of Example 23, wherein the metal plate further comprises: a first foot connected to the first leg, wherein the first foot contacts the second surface of the substrate; and a second foot connected to the second leg, wherein the second foot contacts the second surface of the substrate.

Example 25: the electronic system of Example 24, wherein the metal plate has a top hat shaped cross-section.

What is claimed is:

1. A printed circuit board (PCB), comprising:
a substrate with a first surface and a second surface opposite from the first surface;
a first slot through a thickness of the substrate;
a second slot through the thickness of the substrate, wherein the first slot is parallel to the second slot;
a third slot through the thickness of the substrate;
a first metal plate, wherein the first metal plate comprises:
a first portion over the first surface of the substrate between the first slot and the second slot;
a second portion connected to the first portion, wherein the second portion is in the first slot; and
a third portion connected to the first portion, wherein the third portion is in the second slot; and
a second metal plate, wherein the second metal plate comprises:
a fourth portion on the first surface of the substrate between the second slot and the third slot:
a fifth portion connected to the fourth portion, wherein the fifth portion is in the second slot; and
a sixth portion connected to the fourth portion, wherein the sixth portion is in the third slot.

2. The PCB of claim 1, wherein the first portion of the first metal plate is thermally coupled to a conductive layer exposed on the first surface of the substrate.

3. The PCB of claim 1, wherein the first metal plate further comprises:
a seventh portion connected to the second portion, wherein the seventh portion contacts the second surface of the substrate; and
an eighth portion connected to the third portion, wherein the eighth portion contacts the second surface of the substrate.

4. The PCB of claim 3, wherein the seventh portion and the eighth portion contact metal exposed on the second surface of the substrate.

5. The PCB of claim 4, wherein the metal exposed on the second surface of the substrate is configured to be grounded.

6. The PCB of claim 3, further comprising:

a graphite layer on the seventh portion and the eighth portion.

7. The PCB of claim 1, wherein the metal plate comprises copper.

8. An electronic system, comprising:

a printed circuit board (PCB) with a first surface and a second surface opposite from the first surface, wherein slots extend through a thickness of the PCB;

a first heat spreader inserted through the slots of the PCB, wherein a bottom portion of the first heat spreader is folded against the second surface of the PCB;

a second heat spreader inserted through the slots of the PCB, wherein a bottom portion of the heat spreader is folded against the second surface of the PCB, and wherein the second heat spreader and the heat spreader share one of the slots; and an electronic package coupled to the PCB, wherein the electronic package comprises:

a die between a package substrate and the PCB, and wherein the die is thermally coupled to the first heat spreader by a thermal interface material (TIM).

9. The electronic system of claim 8, further comprising:

a gasket around the die between the package substrate and the PCB.

10. The electronic system of claim 9, further comprising:

a liquid TIM disposed around the die and into the shared slot.

11. The electronic system of claim 8, further comprising:

a graphite layer on the bottom portion of the first heat spreader.

12. The electronic system of claim 8, further comprising:

a second die on the package substrate opposite from the die.

13. The electronic system of claim 8, wherein the first heat spreader comprises copper.

14. The electronic system of claim 8, wherein the bottom portion of the first heat spreader contacts a metal on the second surface of the PCB.

15. A printed circuit board (PCB), comprising:

a substrate with a first surface and a second surface opposite from the first surface;

a first slot through a thickness of the substrate;

a second slot through the thickness of the substrate, wherein the first slot is parallel to the second slot;

a metal plate, wherein the metal plate comprises:

a first portion over the first surface of the substrate between the first slot and the second slot;

a second portion connected to the first portion, wherein the second portion is in the first slot;

a third portion connected to the first portion, wherein the third portion is in the second slot;

a fourth portion connected to the second portion, wherein the fourth portion contacts the second surface of the substrate; and a fifth portion connected to the third portion, wherein the fifth portion contacts the second surface of the substrate; and a graphite layer on the fourth portion and the fifth portion.

16. An electronic system, comprising:

a printed circuit board (PCB) with a first surface and a second surface opposite from the first surface, wherein slots extend through a thickness of the PCB;

a heat spreader inserted through the slots of the PCB, wherein a bottom portion of the heat spreader is folded against the second surface of the PCB;

a graphite layer on the bottom portion of the heat spreader; and an electronic package coupled to the PCB, wherein the electronic package comprises:

a die between a package substrate and the PCB, and wherein the die is thermally coupled to the heat spreader by a thermal interface material (TIM).

* * * * *